(12) United States Patent
Scudder et al.

(10) Patent No.: US 12,347,652 B2
(45) Date of Patent: Jul. 1, 2025

(54) METHOD FOR FORMING PLASMA COATING

(71) Applicant: Applied Materials, Inc., Santa Clara, CA (US)

(72) Inventors: Lance A. Scudder, Sunnyvale, CA (US); Sukti Chatterjee, San Jose, CA (US); David Masayuki Ishikawa, Mountain View, CA (US); Yuriy V. Melnik, San Jose, CA (US); Vibhas Singh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/741,228

(22) Filed: May 10, 2022

(65) Prior Publication Data

US 2022/0375723 A1 Nov. 24, 2022

Related U.S. Application Data

(60) Provisional application No. 63/192,471, filed on May 24, 2021.

(51) Int. Cl.
*H01J 37/32* (2006.01)
*C23C 16/02* (2006.01)
(Continued)

(52) U.S. Cl.
CPC .... *H01J 37/32449* (2013.01); *C23C 16/0272* (2013.01); *C23C 16/345* (2013.01);
(Continued)

(58) Field of Classification Search
None
See application file for complete search history.

(56) References Cited

U.S. PATENT DOCUMENTS 6,419,626 B1 * 7/2002 Yoon .................. A61B 1/00052
600/117
2002/0011264 A1 * 1/2002 Saito .................... H01L 31/206
136/258
(Continued)

FOREIGN PATENT DOCUMENTS

CN 1795289 B 9/2010
CN 102917805 B 7/2016
(Continued)

OTHER PUBLICATIONS

International Search Report and Written Opinion mailed on Aug. 26, 2022 in International Patent Application No. PCT/US2022/028449, 14 pages.
(Continued)

*Primary Examiner* — Francisco W Tschen
(74) *Attorney, Agent, or Firm* — Kilpatrick Townsend & Stockton LLP

(57) ABSTRACT

Exemplary methods of forming a coating of material on a substrate may include forming a plasma of a first precursor and an oxygen-containing precursor. The first precursor and the oxygen-containing precursor may be provided in a first flow rate ratio. The methods may include depositing a first layer of material on the substrate. While maintaining the plasma, the methods may include adjusting the first flow rate ratio to a second flow rate ratio. The methods may include depositing a second layer of material on the substrate.

12 Claims, 11 Drawing Sheets

(51) Int. Cl.
    *C23C 16/34*     (2006.01)
    *C23C 16/40*     (2006.01)
    *C23C 16/44*     (2006.01)
    *C23C 16/455*     (2006.01)
    *C23C 16/50*     (2006.01)
    *C23C 16/54*     (2006.01)

(52) U.S. Cl.
    CPC ............ *C23C 16/40* (2013.01); *C23C 16/403* (2013.01); *C23C 16/4408* (2013.01); *C23C 16/45536* (2013.01); *C23C 16/4554* (2013.01); *C23C 16/45553* (2013.01); *C23C 16/45555* (2013.01); *C23C 16/50* (2013.01); *C23C 16/54* (2013.01); *H01J 37/32743* (2013.01); *H01J 37/32752* (2013.01); *H01J 2237/20278* (2013.01); *H01J 2237/332* (2013.01); *H01J 2237/3321* (2013.01)

(56) References Cited

U.S. PATENT DOCUMENTS

| | | | |
|---|---|---|---|
| 2006/0264044 A1 | 11/2006 | Kobayashi et al. | |
| 2007/0054064 A1 | 3/2007 | Ohmi et al. | |
| 2008/0173348 A1* | 7/2008 | Nasuno | C23C 16/4408 |
| | | | 438/96 |
| 2008/0182101 A1 | 7/2008 | Carcia et al. | |
| 2009/0293936 A1* | 12/2009 | Myong | H01L 31/02167 |
| | | | 136/246 |
| 2011/0020546 A1 | 1/2011 | Hamalainen et al. | |
| 2012/0028454 A1 | 2/2012 | Swaminathan et al. | |
| 2013/0199599 A1* | 8/2013 | Fukuda | C08J 5/18 |
| | | | 523/400 |
| 2015/0079309 A1 | 3/2015 | Krueger et al. | |
| 2016/0015600 A1* | 1/2016 | Weikart | C23C 16/45523 |
| 2018/0170019 A1 | 6/2018 | Fayet et al. | |
| 2018/0323401 A1 | 11/2018 | Sato et al. | |
| 2020/0115519 A1* | 4/2020 | Phillips | C09D 1/00 |
| 2021/0101176 A1 | 4/2021 | Baltazar et al. | |
| 2022/0177094 A1* | 6/2022 | Ohl | C23C 16/045 |

FOREIGN PATENT DOCUMENTS

| | | |
|---|---|---|
| CN | 107108073 A | 8/2017 |
| TW | 201326449 A | 7/2013 |
| TW | 202037755 A | 10/2020 |
| WO | 2014-052792 A1 | 4/2014 |

OTHER PUBLICATIONS

U.S. Appl. No. 17/741,252, filed May 10, 2022, Non-Final Office Action mailed Feb. 15, 2024, 11 pages.

* cited by examiner

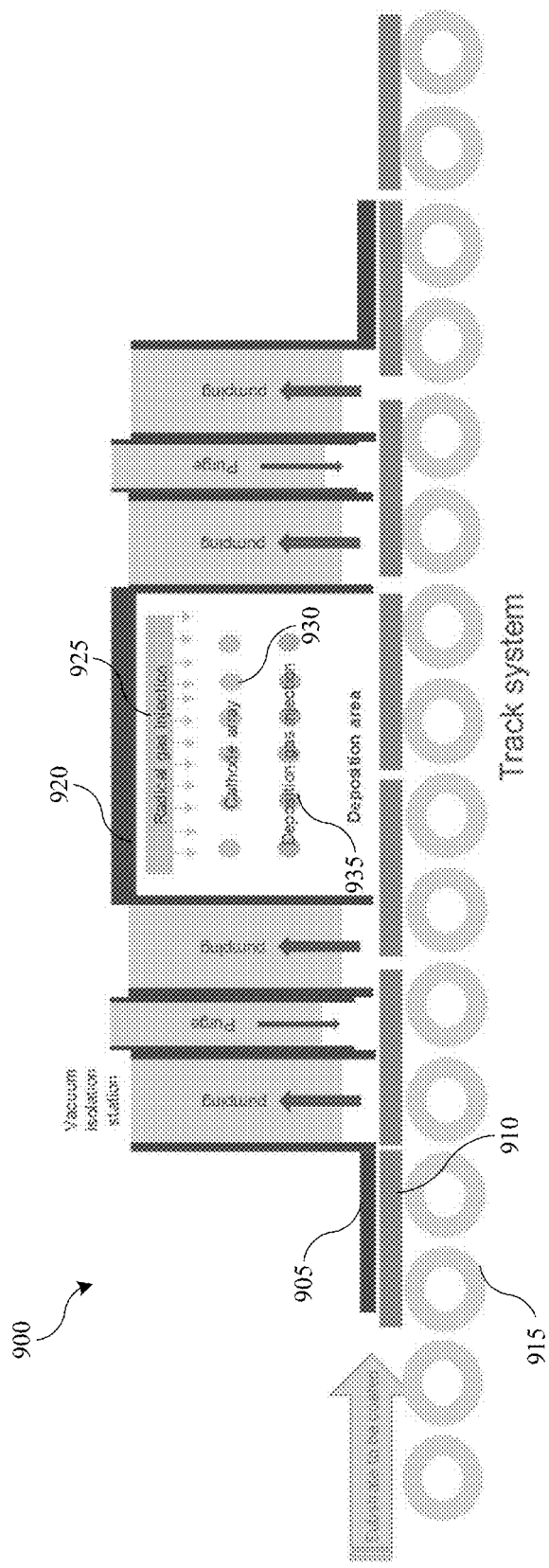
FIG. 9A
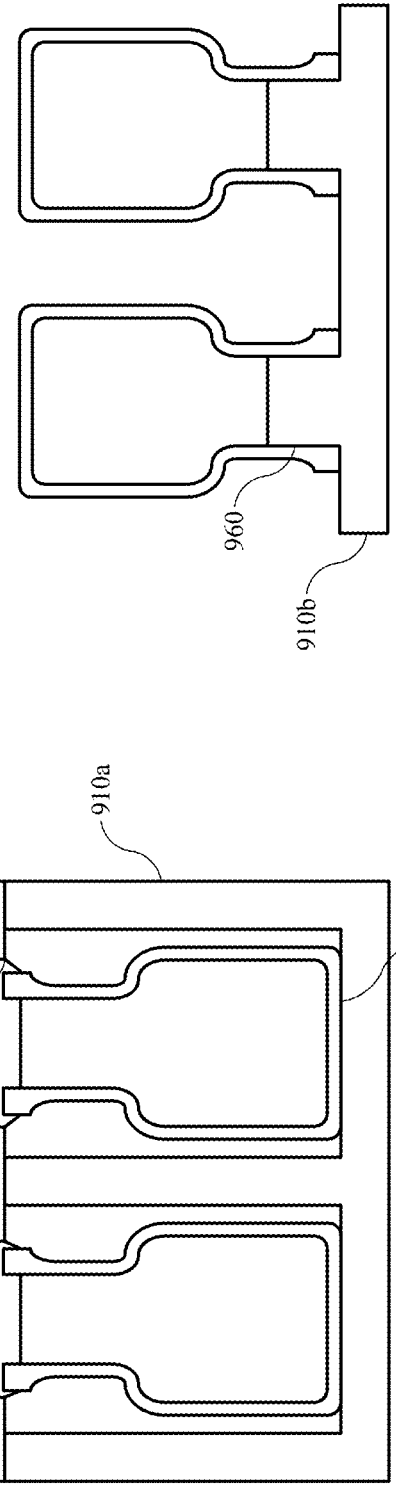
FIG. 9B
FIG. 9C

METHOD FOR FORMING PLASMA COATING

CROSS-REFERENCE TO RELATED APPLICATIONS

This application claims the benefit of, and priority to U.S. Provisional Application Ser. No. 63/192,471, filed May 24, 2021, which is hereby incorporated by reference in its entirety for all purposes.

TECHNICAL FIELD

The present technology relates to processing systems, methods of packaging, and products for medical packaging. More specifically, the present technology relates to systems and methods for producing layers of material on medical products and devices, as well as the components including layers of material.

BACKGROUND

Pharmaceutical and medical packaging may include coated materials that may come into contact with drugs or medicine. The packaging material or the coatings may interact with the incorporated drug or medicine, or may add undesirable extracted materials and leachable materials to the drug. These interactions may cause a negative impact on the drug or medicine, affect the drug potency or shelf life, and may trigger immune responses in patients. Thus, there is a need for improved systems and methods that can be used to produce high quality devices, materials, and packaging solutions. These and other needs are addressed by the present technology.

SUMMARY

Exemplary methods of forming a coating of material on a substrate may include forming a plasma of a first precursor and an oxygen-containing precursor. The first precursor and the oxygen-containing precursor may be provided in a first flow rate ratio. The methods may include depositing a first layer of material on the substrate. While maintaining the plasma, the methods may include adjusting the first flow rate ratio to a second flow rate ratio. The methods may include depositing a second layer of material on the substrate.

In some embodiments, adjusting the first flow rate ratio to a second flow rate ratio may include increasing a ratio of a flow rate of the oxygen-containing precursor relative to a flow rate of the first precursor. The first layer of material may be characterized by a first concentration of carbon and hydrogen. The second layer of material may be characterized by a second concentration of carbon and hydrogen less than the first concentration of carbon and hydrogen. Adjusting the first flow rate ratio to a second flow rate ratio may be performed to produce a concentration gradient along a thickness of the coating of material. Prior to forming the plasma of the first precursor and the oxygen-containing precursor, the methods may include treating a surface of the substrate with a plasma. Subsequent depositing the second layer of material on the substrate, the methods may include treating a surface of the substrate with a plasma. The methods may include depositing a halogen-containing layer overlying the second layer of material. The methods may include repeating the method to produce at least two additional layers on the substrate. The substrate may be or include a vial or container, a syringe, a syringe plunger, a vial stopper, a surgical instrument, or a medical implant. The first precursor may be or include one or more of silicon, titanium, tantalum, aluminum, hafnium, zinc, indium, zirconium, antimony, or germanium.

Some embodiments of the present technology may encompass methods of forming a coating of material on a substrate. The methods may include forming first layer of material on a substrate. The first layer of material may be characterized by a first carbon concentration. The methods may include forming a second layer of material on the substrate. The second layer of material may be characterized by a second carbon concentration less than the first carbon concentration. The methods may include forming a third layer of material on the substrate. The methods may include forming a fourth layer of material on the substrate. The fourth layer of material may be similar to the second layer of material.

In some embodiments, the second layer of material and the fourth layer of material may be characterized by a thickness of less than or about 50 nm. Prior to forming the first layer of material on the substrate, the methods may include treating a surface of the substrate with a plasma. Subsequent forming the fourth layer of material on the substrate, the methods may include treating a surface of the substrate with a plasma. The methods may include depositing a halogen-containing layer overlying the fourth layer of material. The substrate may be or include a vial or container, a syringe, a syringe plunger, a vial stopper, a blister pack, a medical patch, an infusion device, a surgical instrument, or a medical implant. At least one of the first layer of material, the second layer of material, the third layer of material, or the fourth layer of material may be or include one or more of silicon, titanium, tantalum, aluminum, hafnium, zinc, indium, zirconium, antimony, or germanium.

Some embodiments of the present technology may encompass methods of forming a coating of material on a substrate. The methods may include sequentially contacting a substrate with a first precursor to form first terminations and a second precursor to react with the first terminations to form a first layer of material on the substrate. The methods may include forming a second layer of material on the substrate. the substrate may be or include a vial or container, a syringe, a syringe plunger, a vial stopper, a surgical instrument, or a medical implant.

In some embodiments, prior to sequentially contacting the substrate, the methods may include treating a surface of the substrate with a plasma. Subsequent forming the second layer of material on the substrate, the methods may include treating a surface of the substrate with a plasma. The methods may include depositing a halogen-containing layer overlying the second layer of material. The methods may include repeating the method to produce at least two additional layers on the substrate. The temperature may be changed for a subsequent operation of sequentially contacting the substrate with the first precursor to form first terminations and the second precursor to react with the first terminations. At least one of the first layer of material or the second layer of material may be or include one or more of silicon, titanium, tantalum, aluminum, hafnium, zinc, indium, zirconium, antimony, or germanium.

The second layer of material may be formed by an atomic layer deposition utilizing a different material from the first layer of material. The second layer of material may be formed by a plasma-enhanced chemical vapor deposition. The plasma-enhanced chemical vapor deposition may include forming a plasma of a second precursor different from the first precursor and an oxygen-containing precursor.

The second precursor and the oxygen-containing precursor may be provided in a first flow rate ratio. The plasma-enhanced chemical vapor deposition may include depositing the second layer of material on the substrate. Sequentially contacting a substrate may be performed at a substrate temperature less than or about 200° C. The first layer of material may be or include aluminum oxide. The first layer of material may be characterized by a thickness of less than or about 50 nm. The first layer of material may be characterized by a thickness of less than or about 20 nm. The second layer of material may be or include silicon nitride. The second layer of material may be characterized by a thickness of greater than or about 50 nm. The second layer of material may be characterized by a thickness of greater than or about 100 nm.

Some embodiments of the present technology may encompass methods of forming a coating of material on a substrate. The methods may include delivering a set of substrates into a processing chamber. The methods may include forming a first layer of material on each substrate of the set of substrates. The methods may include forming a second layer of material on the set of substrates. The set of substrates may be or include a set of vials or containers, a set of syringes, a set of syringe plungers, a set of vial stoppers, a set of surgical instruments, or a set of medical implants.

In some embodiments, the processing chamber may be or include an inline deposition system. The substrate may be or include a continuous sheet of material defining the set of syringe plungers or the set of vial stoppers. The set of substrates may be delivered on a tray, and the tray may seat each substrate of the set of substrates to define a coating surface. The set of substrates may be or include a set of vials, and the coating surface may include an inside surface of each vial of the set of vials or the outside surface of each vial of the set of vials. The processing chamber may be or include a linear plasma system including a track for receiving the set of substrates. The processing chamber may include one or more plasma nozzles arranged to align with a substrate of the set of substrates.

Such technology may provide numerous benefits over conventional systems and techniques. For example, the present technology may form material layers on devices to limit water and oxygen ingression. Additionally, the present technology may provide enhanced material layers that may protect medical materials and enhance shelf life compared to conventional technologies. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 9A shows a schematic cross-sectional view of an exemplary processing chamber according to some embodiments of the present technology.

FIGS. 9B-9C show schematic cross-sectional views of exemplary substrates as may be delivered to processing chambers according to some embodiments of the present technology.

Figure 1A:
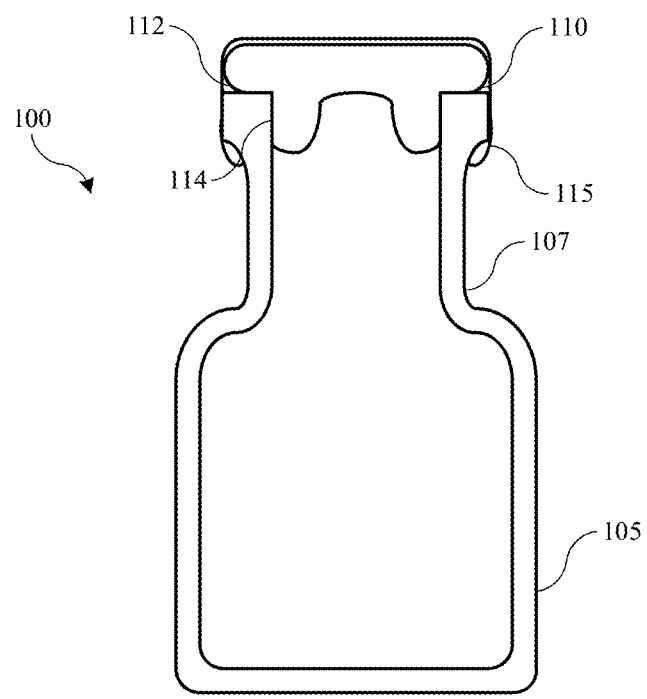
FIGS. 1A-1B show schematic cross-sectional views of exemplary substrates according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In medical materials packaging, the materials used to hold, transport, and store drugs may affect the shelf life, stability, and purity of the drug in a number of ways. For example, prior to use, a drug or other medical material may be stored in any number of packages that may include one or more of plastic, glass, rubber, polymeric materials, metals, paper, or other packaging materials. These materials may be in contact with the drug, and in some circumstances if not protected, may leach contaminants into the drug. Additionally, some of these packaging materials may not be impervious to moisture, oxygen, or other airborne materials. For example, many plastics and polymeric materials may be characterized by a permeation that may allow water or oxygen in the air to permeate or penetrate the packaging.

The moisture may destabilize drugs that may be included at precise environmental conditions, and water or oxygen may negatively interact with the drug being contained. This may limit or reduce shelf life of the drug, negatively affect the drug efficacy, and may produce less potent, contaminated, or toxic materials.

Although materials may be selected in an attempt to address these issues, a number of challenges and limitations with conventional technology remain. For example, glass containers may be characterized by lower permeability than plastic materials, although glass containers more readily fracture causing potential injury and drug loss. Plastic containers may be characterized by permeability through the container, which may decrease shelf life compared to glass containers. Additionally, for each container, a closure may be used that includes one or more materials. The closure may include a stopper, which may be a rubber or rubber-like material intended to fit within a mouth of the container. A cap, such as an aluminum stamping, may be fitted about the stopper and the container. The materials used for the stopper may include contaminants that if left unprotected may leach from the stopper and contaminate the drug. Although the aluminum cap may provide a vapor barrier in some respects, the contact about the container may not be complete, which may still afford a path for vapor ingression. Additionally, although the cap may afford benefits during transportation, the cap may be removed prior to complete use of the drug, which may lower shelf life as the stopper may not be characterized by a higher degree of permeability.

An additional issue with rubber stoppers, or plungers in a syringe, is the ability to remove or displace the drug. For example, a syringe may be pre-loaded with a drug and then transported for use. The syringe may include a plunger that forms a drug leakage barrier within the syringe on a backside of the syringe. The plunger may be characterized by a break-loose force required to begin drug delivery from the syringe. This force required to initiate movement of the plunger may be greater than a force required to continue drug delivery. If not properly controlled, the increased force used to release the plunger may cause overdosing of the drug due to a loss of control once the plunger initiates movement. To reduce this issue, many packages include a lubricant, such as silicon oil, along a surface of the plunger to lower the break-loose force. However, the drug will be exposed to silicon oil, which may impact aspects of the drug. Silicone oil may also be included on stoppers to facilitate removal, such as subsequent to lyophilization operations, which may cause a pressure differential that challenges removal of the stopper. Additionally, laminates, such as fluorinated polymer laminates may be applied on surfaces to facilitate release. However, laminates tend to be less automation friendly, such as requiring manual alignment, which may limit the ability to adequately address complex geometries and topographical changes across the components. Additionally, conventional laminates have limited applicability as a lubricious layer, and do not prevent oxygen and moisture ingress into housed drugs.

Along with manufacturing issues described further below, conventional technologies have been unable to resolve many of these existing challenges and issues. For example, although some conventional technologies may perform deposition of barrier materials on a surface of a container or stopper, the barrier may be fragile and prone to cracking or pinhole defects. This may allow the barrier to be penetrated, and may cause particles to be incorporated into the drug. Additionally, many conventional technologies may produce barriers on a single surface, which may limit protection to a single direction, while allowing alternative leakage paths that may result in drug spoliation.

The present technology relates to providing coatings for drug and medicine containment devices, coatings, systems, and methods of producing coatings for a variety of medical industry materials and devices. As will be described further below, the present technology produces multi-layer barriers and/or gradient-layer barriers that may provide a superior water and oxygen barrier, while improving mechanical characteristics of the materials formed. Accordingly, by utilizing coatings according to embodiments of the present technology, shelf life may be improved over conventional technologies. Additionally, the coatings may allow plastic or polymeric containers to be used over glass containers, which may reduce container breakage and drug loss. Although the remaining disclosure will routinely identify specific processes utilizing aspects of the disclosed technology, or discussing particular components, it will be readily understood that the systems, methods, and coatings are equally applicable to a variety of other devices and processes as may occur in the described chambers, or may otherwise benefit from coatings discussed below. Accordingly, the technology should not be considered to be so limited as for use with the described components and deposition processes alone. The disclosure will discuss non-limiting components on which coatings according to embodiments of the present technology may be applied, before describing operations of exemplary processes and exemplary deposition systems that may be used according to embodiments of the present technology.

Figure 1B:
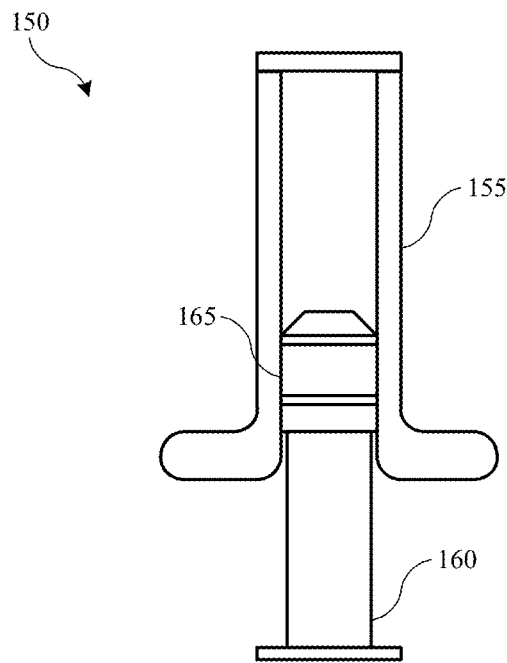

FIGS. 1A-1B show schematic cross-sectional views of exemplary substrates according to some embodiments of the present technology. As discussed above, coatings according to some embodiments of the present technology may be applied to one or more surfaces of a number of materials or devices. Although two common containers having components will be described in relation to materials that may be coated according to embodiments of the present technology, it is to be understood that the present technology is not limited to containers, syringes, stoppers, and plungers, and coatings according to embodiments of the present technology may also be applied to any number of blister packs, medical patches, infusion devices, surgical instruments, medical implant devices or medical implant device components, surgical or operation suite components, waste containment components, hazardous or toxic containment components, food or perishable containment components, or any other device or component that may benefit from any coating or characteristic as discussed throughout the present technology. It is to be understood that substrates as discussed below in coating methods may include one or more of any of these products or components.

Shown in FIG. 1A is a container 100, which may schematically represent a drug receptacle that may be used in the transportation or storage of drugs, and may include one or more components that may be coated according to embodiments of the present technology. The vessel 105 may be a vial or container used to store or hold any number of drug or drug-related materials, including sterile materials, biocompatible materials, or any other materials to be maintained. Vessel 105 may be glass, polymeric or plastic materials, or other materials. Vessel 105 may be characterized by any shape or profile, which may include a neck portion 107 defining a mouth in which a stopper or closure may be disposed. As shown, the diameter of the vessel 105 may expand from the neck into the body, and which may define a number of arcuate surfaces. Vessel 105 is not intended to be limiting, but is intended merely to illustrate one type of vessel shape. It is to be understood that more complex or simple shapes are similarly encompassed by the present technology.

Disposed within the mouth of vessel 105 may be stopper 110 or a closure, which may be removably seated within the mouth of the vessel 105, and may at least partially extend within neck portion 107 of the vessel. The stopper may be or include rubber, polymeric or plastic materials, or any other materials. In some embodiments the stopper 110 may include a flange portion 112, which may seat on an upper surface of the vessel as illustrated, and a body portion 114, which may seat within the neck portion 107 of the vessel 105. The body portion 114 of stopper 110 may be characterized by an exterior diameter that may be at least slightly larger than an inner diameter of the neck portion 107 of the vessel. This may facilitate a seal, including a hermetic seal, to prevent leakage from the container 100. Stopper 110 may also define a number of features about the body portion 114, including interior cavities as shown, as well as internal cutouts or windows, such as may facilitate a lyophilization process. The body portion 114 may also define a number of ribs or seals to compressibly seat against an interior wall of the neck 107 of the vessel 105. About the coupling between the stopper 110 and vessel 105 may be a cap 115, which may be crimped or fitted about the vessel and may fully extend about the stopper 110 above the vessel. The cap may be or include a metal covering, such as aluminum, and may define a break or tab to facilitate removing the cap from the container 100.

FIG. 1B illustrates a syringe 150 or applicator in which a drug may be stored or maintained, and which may include one or more components that may be coated according to embodiments of the present technology. Syringe 150 may include a housing 155, which may define a lumen or cavity in which a drug may be maintained. Although shown as being substantially cylindrical, it is to be understood that syringes according to embodiments of the present technology may be characterized by a tapered neck or head, as well as by any other shape which may facilitate containment or delivery. Housing 155 may be or include glass, plastic or polymeric material, or any other material. Disposed within a base of the housing 155 may be a handle 160. Handle 160 may include a plunger 165, which may movably seat within the housing 155, and may be configured to express a drug or material from a front of the syringe 150. While handle 160 may not contact a drug or material contained within the syringe, plunger 165 may be in direct contact with a drug or material consistently until use. Plunger 165 may be characterized by any shape including a tapered front end to accommodate a taper of a neck portion of a syringe, and plunger 165 may define one or more ribs or seal portions, which may compressibly seat against an interior wall of the housing 155.

Plunger 165 may be characterized by any of the materials notes above, including rubber, plastics or polymeric materials, among any other material or combination of materials. Unlike stopper 110, which may be simply removed to access the drug contained within vessel 105, plunger 165 may be forcibly moved along the housing to express the drug. Accordingly, a break-loose force and a continuation force for moving the plunger may be additional characteristics of the syringe 150 as a package, which may affect operation of the syringe 150 as a device. As noted above, FIGS. 1A-1B illustrate examples of numerous containers or components on which coatings according to the present technology may be applied, and the examples are not intended to limit the number or shapes of substrates according to embodiments of the present technology.

As noted above containers or components of the containers may be or include any number of materials according to embodiments of the present technology. For example, containers, such as vessel 105 and/or syringe housing 155, may be or include glass, which may include one or more materials. The glass may be a borosilicate or other glass, which may include one or more of silicon oxide, aluminum oxide, barium oxide, boric oxide, calcium oxide, magnesium oxide, potassium oxide, sodium oxide, as well as other constituent materials of glass, which may be combined in a number of ratios to produce containers of various resistance and stability. The containers may also be a plastic or polymeric material. Any number of polymers may be used alone or in combination to produce containers according to embodiments of the present technology. For example, exemplary materials that may be included in one or more containers may include polyamides, such as nylon, polypropylene, polyethylene, cyclic olefin polymers, cyclic olefin copolymers, among any number of other materials that may be used to produce a container.

Figure 2:
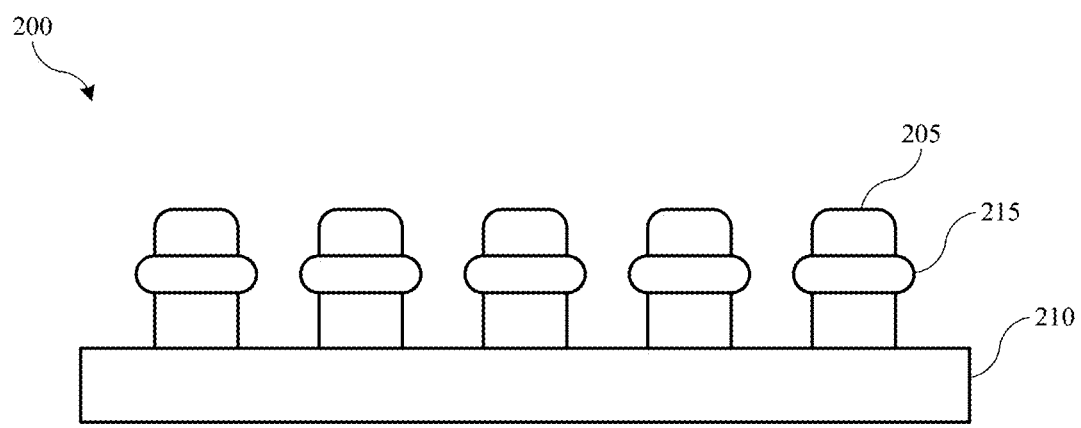
FIG. 2 shows a schematic cross-sectional view of an exemplary substrate sheet according to some embodiments of the present technology.

The stoppers and plungers may be made of any number of materials, including polymeric materials or rubbers. For example, any number of elastomers, including thermoplastic elastomers, and including butyl thermoplastic elastomers may be used. Butyl polymers may include halobutyl materials, such as chlorinated or brominated butyl rubber, and may be used as or in any of the substrates on which coatings may be applied as described further below. During production, the components may be trimmed or separated, or maintained in groups, such as sheets of materials. For example, FIG. 2 shows a schematic cross-sectional view of an exemplary substrate sheet 200 according to some embodiments of the present technology. Stoppers or plungers may be coated according to embodiments of the present technology either in individual form or on sheets prior to separation as shown. For example, sheets of formed stoppers or plungers may be provided or delivered to deposition systems as described further below, which may facilitate multi-component deposition. Conventional technologies may have been challenged with deposition in this format based on the structural complexity of the components.

For example, as shown on substrate sheet 200, the stoppers or plungers 205 may extend from a base sheet 210. The components may extend vertically within the deposition chamber or system, while the base sheet 210 may be translated along a track or roller system, for example. Typical chemical-vapor deposition systems may have an amount of directionality to the deposition, which may limit conformal coverage. For example, and as noted above, many stoppers and/or plungers may be characterized by a number of ribs 215 or seals to interface with the container. Because the backside of the ribs as well as sidewalls beneath the ribs may not have line-of-sight access for deposition products, coverage may be limited. This may cause excess thinning of barrier layers, as well as gaps, which may increase permeability into the container, and which may lower shelf life of the drug. The present technology may overcome these issues by utilizing a number of techniques and systems for forming more conformal layers on materials characterized by planar and/or non-planar topography.

Figure 3:
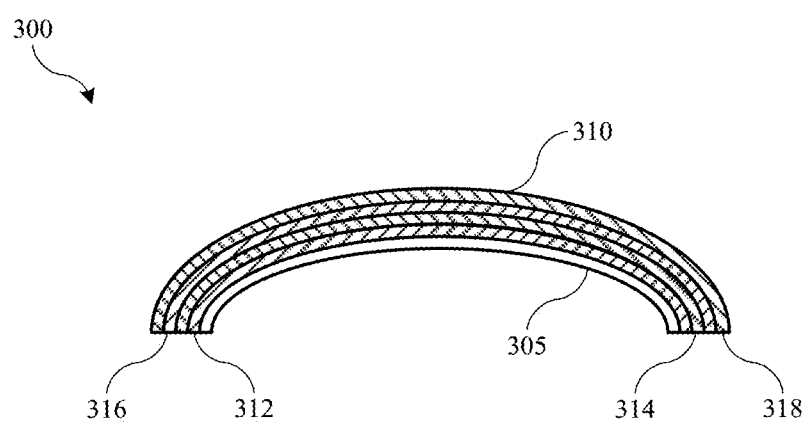
FIG. 3 shows a schematic cross-sectional view of an exemplary coating material produced according to some embodiments of the present technology.

Additionally, conformal coatings may have issues related to film characteristics, such as permeability and mechanical integrity. For example, some barrier layer materials may be characterized by acceptably low permeability, although the films tend to be more brittle. As the materials sit over time, or as the components are manipulated, such as by removing and reseating a stopper, the barrier materials may crack or fragment, which may cause particles to be incorporated into remaining drug material. This may also form gaps in coverage, which may increase water and/or oxygen transmission, as well as allowing impurities from the component to leach into the drug. Additionally, many conventional barrier materials may be characterized by reduced adhesion to substrates, which may further limit the structural integrity of the coating. The present technology overcomes these issues by producing gradient-based and/or multi-material or multi-layer structures, which may tune characteristics of the materials to improve overall effectiveness and integrity of the coatings. For example, FIG. 3 shows a schematic cross-sectional view of an exemplary coated material 300 produced according to some embodiments of the present technology. A substrate 305, which may be any surface of any component discussed previously, and is not intended to be limited by what is shown, may have a coating 310 formed or deposited overlying the substrate. The coating may include one or more layers of material, and may include a plurality of layers of material formed over the substrate.

The illustrated coating 310 is shown with four layers, but coatings according to some embodiments of the present technology may include greater than or about one layer, and may include greater than or about three layers, greater than or about four layers, greater than or about five layers, greater than or about six layers, greater than or about seven layers, greater than or about eight layers, greater than or about nine layers, greater than or about ten layers, greater than or about twelve layers, greater than or about fifteen layers, greater than or about twenty layers, greater than or about thirty layers, greater than or about fifty layers, greater than or about one hundred layers, or more. Although the four layers are illustrated as being of equivalent thickness, in some embodiments of the present technology each layer may be characterized by a greater or lesser thickness than any other layer of the configuration, as well as being characterized by a similar thickness as any other layer. In some embodiments, the coating may include alternating layers of materials as illustrated, where layers 312 and 316 may be similar or identical materials, and layers 314 and 318 may be similar or identical materials. In some embodiments the materials in adjacent layers may also be similar materials with differently tuned characteristics, or two or more layers may be less distinguishable, but may be characterized by a gradient adjusting one or more characteristics through the layer. Coating materials according to embodiments of the present technology may be formed by a number of processes or in a combination of processes, and may be formed in one or more chambers to form layers of materials.

Layers of coating materials according to embodiments of the present technology may be formed to any thickness in embodiments of the present technology. For example, any layer in any coating configuration, as well as a full composite coating, may be characterized by a thickness of less than or about 1000 nm, and may be characterized by a thickness of less than or about 750 nm, less than or about 500 nm, less than or about 250 nm, less than or about 200 nm, less than or about 150 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 15 nm, less than or about 12 nm, less than or about 10 nm, less than or about 5 nm, less than or about 2 nm, less than or about 1 nm, or less. However, to ensure complete coverage of each layer, in some embodiments coatings may be maintained at greater than or about 2 nm, greater than or about 5 nm, or more.

Barrier layers in conventional technologies are often discussed in broad ranges, but are practically formed at thickness of greater than or about 20 nm, greater than or about 50 nm, greater than or about 100 nm, or more, which may be to provide a certain limit on permeation through the layer. However, and as noted above, many of these layers may be characterized by a more brittle nature, which may be exacerbated as films are formed to greater thickness. In some embodiments of the present technology, barrier layers may be counterintuitively reduced in thickness, which may lower the barrier properties, although the layers may be characterized by improved flexibility and stress characteristics, which may limit fracturing. To overcome the reduction in barrier properties, some coatings may increase the number of individual barrier layers, which may in composite form provide improved barrier protection over conventional coatings, while advantageously being characterized by improved mechanical stability as well. Any of the following methods and/or chamber systems may be used alone or in combination to produce any of the coatings or layers discussed above, and substrates as discussed below may include any surface of any component noted previously. It is to be understood that the following discussion is not intended to be limited to alternative methods or systems, but as exemplary processes and equipment that may be utilized in one or more combinations to produce coatings or coating layers according to some embodiments of the present technology.

Figure 4:
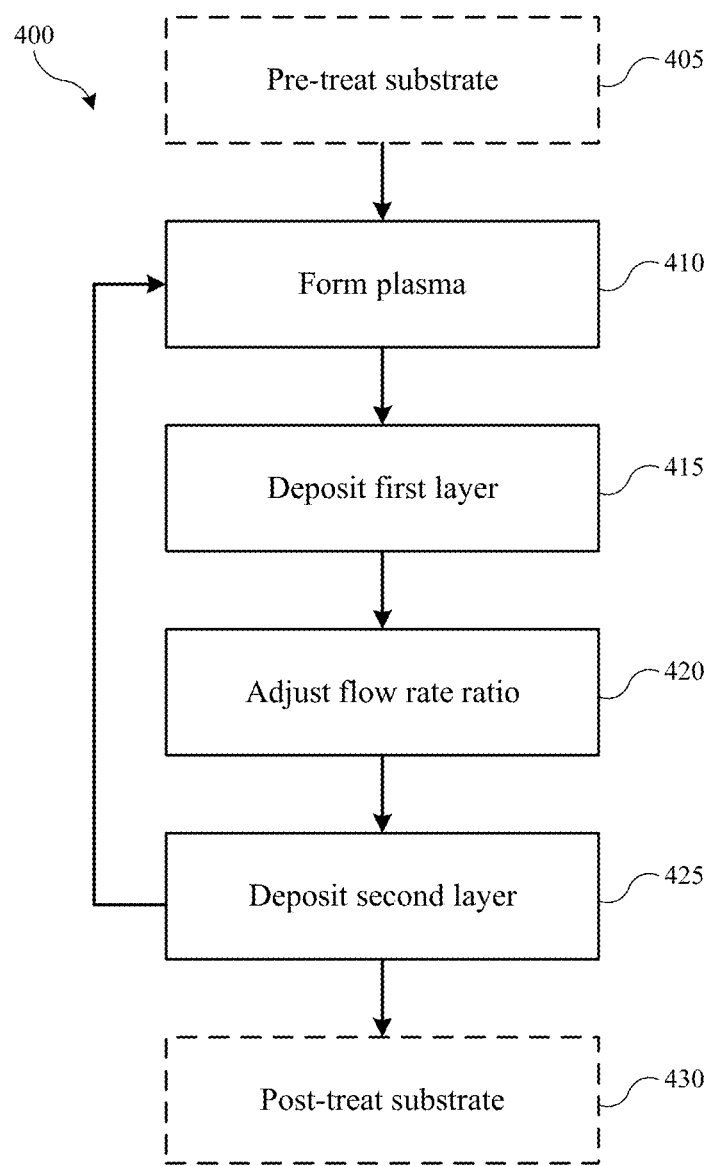
FIG. 4 shows selected operations in a method of forming a coating structure according to some embodiments of the present technology.

Turning to FIG. 4 is shown selected operations in a method 400 of forming a coating structure according to some embodiments of the present technology. Many operations of method 400 may be performed, for example, in the chambers or systems as further described below, as well as any combination of systems discussed, or which may be configured to perform operations as discussed for method 400. Method 400 may include one or more operations prior to the initiation of the method, including processing to produce or prepare a container for application of a coating or a layer of a coating according to embodiments of the present technology, including forming one or more layers, such as by one or more other processes as discussed throughout the present disclosure. For example, upstream processing may include extrusion of elastomeric materials, washing, sterilization, trimming or separation, or any number of other operations to prepare a substrate for coating. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 400 describes the operations of forming any number of layers as shown schematically and discussed above, including in regard to FIG. 3. Method 400 may involve operations for forming a coating by a plasma-enhanced deposition process. The method may form one or more layers of material, which may be characterized by a number of film properties that may improve operation as a barrier layer or additional layer for a coating for medical applications, for example. By forming layers with a plasma process, tuned layers of material may be formed on the substrate.

In some embodiments method 400 may include an operation to treat a surface of a substrate prior to deposition of a layer of material. For example, at optional operation 405, the surface of the substrate on which deposition will occur may be treated. In some embodiments, the treatment may include exposing the surface to plasma. The plasma may be an oxygen-containing plasma, or a plasma of other materials, which may activate the surface of the substrate, improve film adhesion, and/or sterilize the substrate prior to deposition. Pre-treatment operations encompassed by optional operation 405 may include any number of additional operations which may prepare a substrate in one or more ways, and may be combined with any other pre-treatment operations. For example, an additional treatment may include exposing the substrate, or selected surfaces of the substrate, to materials such as ozone or other non-plasma-enhanced materials, which may also clean surfaces of the substrate. Treatments may include exposure to an alcohol or other agent to clean, degrease, or other treat surfaces prior to deposition. Exemplary cleaners may include isopropyl alcohol, acetone, other acidic materials such as Oakite products, deionized water, steam, UV exposure, as well as any other cleaners or agents that may be used to treat substrates. Pre-treatments may also include operations to prepare a surface for deposition or formation, such as use of acid, porosifiers, or etchants to increase surface roughness, among any number of preparations to enhance deposition, increase adhesion, or limit or neutralize surface bonding, such as with passivation, to prevent deposition or formation on certain regions.

At operation 410, the process may include forming a plasma of a first precursor and/or a second precursor. While the first precursor may include a metal or non-metal material for incorporation as a layer of material, the second precursor may include one or more of oxygen, nitrogen, or carbon, which may be incorporated in the film to produce an oxide, a nitride, a carbide, an oxynitride, a carbonitride, or an oxide carbonitride. Although the following discussion will include an oxygen-containing precursor as the second precursor, it is to be understood that the method may include any one or more other materials or alternatives for the second precursor. In embodiments, the first precursor and the second precursor may be provided at a first flow-rate ratio, such as a ratio of a flow rate of the second precursor to a flow rate of the first precursor. Plasma treatments as will be described may produce any number of functional groups or terminations, which may improve the adherence of at layer on the substrate, or an previously formed layer. For example, plasma treatments may produce amine, hydroxyl, carboxyl, aldehyde, epoxide, sulfhydryl, or other functional groups that may be incorporated on or within layers of materials.

At operation 415, the method may include forming or depositing a first layer of material on the substrate. The material may be characterized by any thickness as described previously. In some embodiments, the substrate may be a base substrate, such as having an exposed surface, or the substrate may have one or more layers already formed over the substrate. Once deposited, method 400 may include adjusting a flow rate ratio of the precursors from a first flow rate ratio to a second flow rate ratio different from the first at operation 420. The plasma may be maintained during the adjustment, or in some embodiments the process may include adjusting parameters prior to igniting the plasma for the following operation. For example, when method 400 is performed along a track or inline deposition system, the adjustment may be performed prior to a second pass of the substrate, or in a subsequent chamber in which the following operations may be performed. Maintaining plasma during a transition may facilitate the production of graded layers of material as the gas ratios are adjusted, while halting plasma formation may form more discrete layers of material.

Method 400 may include depositing a second layer of material at operation 425, which may include different characteristics from the first layer based on the adjusted flow-rate ratio between the first and second precursors. One or more operations of method 400 may be repeated any number of times, such as to increase the number of layers produced, and which may include any number of layers as previously described.

Flow rate ratios for plasma deposition may impact characteristics of the film, as well as composition of the film. For example, in some embodiments the process may include forming a plasma of the second precursor to produce plasma effluents, which may activate the first precursor. As one non-limiting example for producing a silicon-and-oxygen-containing layer of material, the first precursor may be a silicon-containing precursor, and the second precursor may be an oxygen-containing precursor. A plasma may be formed of the oxygen-containing precursor, and effluents of which may interact with the silicon-containing precursor to produce deposition products, which may then form a layer of material on the substrate. The ratio of the radical precursor flow rate to the first precursor flow rate may impact film characteristics. For example, when the flow rate ratio of the radical precursor to the first precursor is lower, the layer formed may include additional constituents of the first precursor, which may be due to a lesser amount of precursor breakdown. When carbon may be included in the first precursor, this may cause the film to be more polymeric, which may produce a smoother layer of material, and which may more readily adhere to the substrate. However, such films may be less resistant to steam treatments, such as may occur during sterilization processes performed on a substrate or container subsequent fabrication, which may cause the film to fail. Additionally, when the flow rate ratio of the radical precursor to the first precursor is higher, the layer formed may be more rigid, such as a denser film with a more defined lattice structure. This may increase barrier properties of the film, but as discussed above, this may also increase fragility of the film, and make the film more prone to cracking. The film may also be characterized by a lower degree of adhesion, which can cause layers to delaminate from the substrate.

Accordingly, in some embodiments the flow rate ratio of the second precursor to the first precursor may be lower during the first deposition operation, which may improve film adhesion to the substrate by providing an amount of carbon and/or hydrogen into the film, such as a first concentration of carbon and/or hydrogen. However, the flow rate ratio may be higher than conventional deposition, which may improve the integrity of the film to survive subsequent processing operations, such as steam autoclaving, for example, which may occur at temperatures above 100° C. Subsequently, the flow rate ratio may be increased to a higher ratio of the radical precursor flow rate relative to the first precursor flow rate in the second deposition operation. This may improve the mechanical rigidity of the film, which may improve the operation of the layer as a barrier layer. By densifying the structure, the concentration of carbon and/or hydrogen within the film may be reduced relative to the first layer of material. In some embodiments, the flow rate ratio may not be as high as some conventional operations, which may counterintuitively reduce the effectiveness of the layer as a barrier layer, such as by increasing the permeability of the layer. However, the layer may be more resilient to cracking or fracture during use. Additionally, as noted above, the present technology may incorporate additional layers of material, which may increase the overall barrier effect by incorporating multiple barrier layers, even if each individual layer may be characterized by higher permeability. It is to be understood that the opposite process may also be performed, where the flow rate ratio may be reduced between the two depositions, and where a more barrier-like layer may be formed adjacent the substrate. The carbon and/or hydrogen ratio may be increased for the subsequent layer, which may control a coefficient of thermal expansion mismatch between the layer and the substrate, for example.

In some embodiments, such as within processing environments where modifications may be made during deposition, the process may include forming a single layer of material, but adjusting the ratio during deposition to form a gradient across the film. For example, the flow rate ratio of the radical precursor to the second precursor may be increased during deposition, which may improve adhesion proximate the substrate, or along a portion in contact with the substrate, but may increase barrier performance at locations distal the substrate surface. By forming a gradient, the mechanical integrity of the more barrier-like region of the coating may be improved based on the support provided across the thickness of the layer by underlying material of the coating.

Subsequent formation of the film, regardless of the number of layers produced, one or more post treatment operations may be performed at optional operation 430. For example, similar to a pre-treatment as discussed above, subsequent formation of the film, the coated container or component may be exposed to a plasma, such as an oxygen plasma or inert gas plasma, such as a noble gas, or any other plasma. This may provide sterilization of the container, or may further densify an exterior surface of the film produced. Additionally, the method may include forming an outer layer of material on the film, such as a layer characterized by lubricity, which may facilitate re-closure, such as with a stopper, as well as may reduce break-loose force, such as for a plunger. The method may include forming an outer layer of material on the film, such as a layer characterized by biocompatibility, wettability, or surface pH buffering, which may facilitate foreign particle immobilization, drug utilization, or drug stability.

Additionally, such a layer may be applied to an otherwise uncoated surface of a stopper, for example, which may limit stiction between stoppers being seated in vessels and manufacturing equipment used to insert the stoppers. Although the lubricious film may be applied to the stopper or plunger, in some embodiments the layer may be formed overlying the container surface to be contacted by the stopper or plunger, such as an interior surface of the container. The layer may be a laminate, such as a fluoropolymer or polymer laminate. However, many laminated films are applied manually and are incapable of closely forming to the contours of substrates as described above. Accordingly, in some embodiments a subsequent deposition may be performed to deposit a halogen-containing layer on the coating, such as a layer of polytetrafluoroethylene or some other material, which may be deposited by a subsequent vapor deposition operation including but not limited to atomic layer deposition, molecular layer deposition, or plasma spray deposition.

In some embodiments, the second precursor may be an oxygen-containing precursor, such as diatomic oxygen, ozone, nitrous oxide, hydrogen peroxide, an alcohol, water vapor, or any other oxygen-containing material. The first precursor may include one or more materials, and may include one or more of silicon, titanium, tantalum, tin, aluminum, hafnium, zinc, indium, zirconium, antimony, or germanium. Precursors including any of these materials may include one or more additional materials, such as carbon and hydrogen, oxygen, nitrogen, a halogen, or any number of additional materials. Exemplary precursors may include ammonia, nitrogen, helium, hydrogen, hydrozene, argon, or any number of additional materials. In some embodiments in which a metal may be incorporated in one or more of the layers, the metal-containing layer may be covered with an additional layer of material to limit or prevent corrosion. The additional layer may not include a metal, and may include materials such as silicon, for example.

Exemplary precursors may include any number of materials. For example, silicon-containing precursors that may be used during the formation of any layer may be or include, but are not limited to, silane, disilane, or other organosilanes including cyclohexasilanes, silicon tetrafluoride, silicon tetrachloride, dichlorosilane, tetraethyl orthosilicate (TEOS), tetramethyldisiloxane (TMDSO), hexamethyldisiloxane (HMDSO), hexamethyldisilazane (HMDSN), and silicon tetrakis(ethylmethyamide) (TEMASi), alkylaminosilane, trisilylamine, alkylaminodisilane, alkylsilane, alkyloxysilane, alkylsilanol, and alkyloxysilanolas well as any other silicon-containing precursors that may be used in silicon-containing film formation.

Aluminum-containing precursors may include trimethylaluminum, triethylaluminum, tripropylaluminum, tributylaluminum, trimethoxyaluminum, triethoxyaluminum, tripropoxyaluminum, tributoxyaluminum, trisobutylaluminum, dimethylaluminum hydride aluminum acetylacetonate, trisdiethylamino aluminum, aluminum hexafluoroacetylacetonate, trisdipivaloylmethanatoaluminum, as well any isomers or complexes of any of these or other aluminum-containing materials. Hafnium-containing precursors may include bis(methylcyclopentadiene) dimethylhafnium, bis(methylcyclopentadiene) methylmethoxyhafnium, bis(cyclopentadiene) dimethylhafnium, tetra(tert-butoxy) hafnium, hafniumum isopropoxide, tetrakis(dimethylamino) hafnium (TDMAH), tetrakis(diethylamino) hafnium (TDEAH), tetrakis(ethylmethylamino) hafnium (TEMAH), as well as any isomers or complexes of any of these or other hafnium-containing materials. Titanium-containing precursors may include bis(methylcyclopentadiene) dimethyltitanium, bis(methylcyclopentadiene) methylmethoxytitanium, bis(cyclopentadiene) dimethyltitanium, tetra(tert-butoxy) titanium, titaniumum isopropoxide, tetrakis(dimethylamino) titanium (TDMAT), tetrakis(diethylamino) titanium (TDEAT), tetrakis(ethylmethylamino) titanium (TEMAT), as well as any isomers or complexes of any of these or other titanium-containing materials. Additionally, any of the materials may be provided with any precursors containing the material, and which may be used in deposition as discussed throughout the present disclosure.

A flow-rate ratio of the second or radical precursor to the first precursor may be maintained at greater than or about 1.0:1, and may be maintained at greater than or about 1.1:1, greater than or about 1.2:1, greater than or about 1.3:1, greater than or about 1.4:1, greater than or about 1.5:1, greater than or about 1.6:1, greater than or about 1.7:1, greater than or about 1.8:1, greater than or about 1.9:1, greater than or about 2.0:1, greater than or about 2.1:1, greater than or about 2.2:1, greater than or about 2.3:1, greater than or about 2.4:1, greater than or about 2.5:1, greater than or about 2.6:1, greater than or about 2.7:1, greater than or about 2.8:1, greater than or about 2.9:1, greater than or about 3.0:1, greater than or about 3.1:1, greater than or about 3.2:1, greater than or about 3.3:1, greater than or about 3.4:1, greater than or about 3.5:1, greater than or about 3.6:1, greater than or about 3.7:1, greater than or about 3.8:1, greater than or about 3.9:1, greater than or about 4.0:1, or higher during either or both of the first deposition and the second deposition. Additionally, the flow rate ratio may be maintained at less than or about 10:1, and may be maintained at less than or about 9:1, less than or about 8:1, less than or about 7:1, less than or about 6:1, less than or about 5:1, or less. This may afford films that may be more likely to survive sterilization processes, while also producing barrier layers that may be less likely to fracture. As would be understood by the skilled artisan, flow rate adjustments may be performed in combination with a number of other deposition parameters including RF power, chamber pressure, or substrate temperature, which may produce gradient and multi-layer barriers that may be less likely to fracture.

Figure 5:
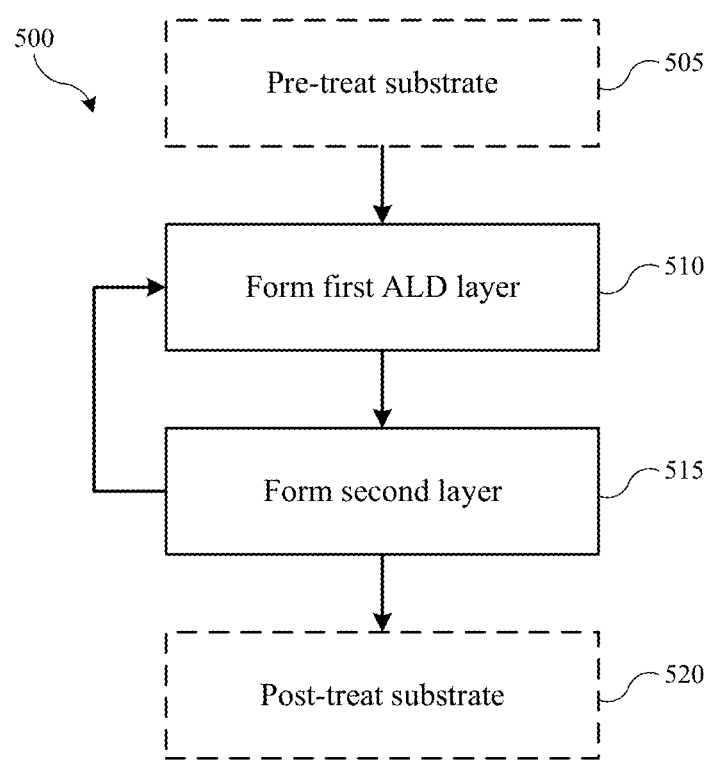
FIG. 5 shows selected operations in a method of forming a coating structure according to some embodiments of the present technology.

FIG. 5 shows selected operations in a method 500 of forming a coating structure according to some embodiments of the present technology. Many operations of method 500 may be performed, for example, in the chambers or systems as further described below, as well as any combination of systems discussed, or which may be configured to perform operations as discussed for method 500. Method 500 may include one or more operations prior to the initiation of the method, including processing to produce or prepare a container for application of a coating or a layer of a coating according to embodiments of the present technology, including forming one or more layers, such as by one or more other processes as discussed throughout the present disclosure. For example, upstream processing may be performed as described above. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 500 describes the operations of forming any number of layers as shown schematically and discussed above, including in regard to FIG. 3. Method 500 may involve operations for forming a coating by an atomic-layer deposition process. The method may form one or more layers of material, which may be characterized by a number of film characteristics that may improve operation as a barrier layer or additional layer for a coating for medical applications, for example. By forming layers with an atomic-layer deposition process, tuned layers of material may be formed on the substrate.

In some embodiments method 500 may include an operation to treat a surface of a substrate prior to deposition of a layer of material, such as described above. For example, at optional operation 505, the surface of the substrate on which deposition will occur may be treated by any operation discussed above. At operation 510 an atomic-layer deposition may be performed to produce a first layer of material on the substrate, or overlying a layer of material on the substrate. The deposition or formation may include sequentially contacting the substrate with a first precursor and a second precursor until a defined thickness of material may be formed. The first precursor, which may be similar to the second precursor in method 400, may be delivered to form first terminations on the substrate, such as oxygen or hydroxyl terminations, for example. The second precursor, which may be similar to the first precursor in method 400, may react with the first terminations to form a first layer of material on the substrate. Method 500 may then include forming a second layer of material at operation 515. The second layer of material may also be formed in a similar process of atomic-layer deposition, or may be formed by a different deposition, such as a plasma-enhanced chemical-vapor deposition as discussed above in method 400. The method may be repeated to form any number of layers as discussed above. Method 500 may also include a post treatment at optional operation 520, which may include any post treatment discussed above, including post treating with plasma, and/or forming an additional layer for lubricity as discussed with method 400.

By performing an atomic-layer deposition, the formation may produce conformal coatings that may accommodate the complex exterior profiles of many of the materials. Precursors used in any of the operations may be or include any of the precursors noted previously. Additionally, the materials may be formed to any thickness as previously described. In some embodiments, one or more deposition or formation parameters may be adjusted, similar to the flow rate ratio, as discussed in method 400. For example, in some embodiments the atomic-layer deposition may be performed with a temperature change between one or more of the layers, or during the deposition operation, which may affect material properties. At lower deposition temperatures, a more flexible film may be produced, which may be characterized by increased permeability, but which may be less likely to crack. This flexibility may be due to increased incorporation of carbon and/or hydrogen, or other materials from the precursors. Additionally, as formation temperature is increased, a denser oxide may be formed, but one which may be more likely to fracture.

Accordingly, in some embodiments the present technology may include formation processes performed at lower deposition temperatures for one or more layers of material. Encompassed processes may also include formation of a subsequent layer by atomic-layer deposition in which the temperature may be changed to a different temperature to increase flexibility of the film, or improve barrier properties relative to an underlying layer. For example, in one or more operations, the temperature of formation during method 500 may be maintained at less than or about 300° C., and may be maintained at less than or about 250° C., less than or about 200° C., less than or about 190° C., less than or about 180° C., less than or about 170° C., less than or about 160° C., less than or about 150° C., less than or about 140° C., less than or about 130° C., less than or about 120° C., less than or about 110° C., less than or about 100° C., less than or about 90° C., less than or about 80° C., less than or about 70° C., less than or about 60° C., less than or about 50° C., less than or about 40° C., less than or about 30° C., less than or about 20° C., or less. Advantageously, this may also allow the atomic-layer deposition to be performed on stopper and/or plunger materials, which may be compromised at higher temperature formation.

As noted above, in some embodiments the second layer of material may be a different material from the first layer. Either layer may include one or more of any of the elements noted previously. As one non-limiting example, in some embodiments a first layer may include aluminum, and a second layer may include silicon, with the layers being in any order within a coating. Continuing the example, the aluminum-containing layer may be or include aluminum oxide, and the silicon-containing layer may be or include silicon nitride, although it is to be understood that any combination of materials including any of the previously noted elements may be formed. Either or both layers may be formed by atomic-layer deposition, and in one example, the aluminum-containing layer may be formed by atomic layer deposition, and the silicon-containing layer may be formed by plasma deposition, such as by some or all operations of method 400 as discussed above.

Either layer of material may be characterized by any of the thicknesses noted above, but in some embodiments the aluminum oxide layer, or whatever material may be formed by atomic-layer deposition, may be formed to a first thickness that may be less than a thickness of the silicon nitride layer, or whatever material may be formed by plasma-enhanced chemical-vapor deposition. Although the permeability may increase by forming a layer of reduced thickness for what may constitute a type of barrier layer, the layer may be characterized by increased flexibility, which may improve operation of the film over time, by reducing the likelihood of fracture. For example, for an atomic-layer-deposited aluminum film, such as aluminum oxide, a critical tensile strain at which cracking can occur may be more than double and up to triple for a film characterized by a thickness of less than or about 15 nm compared to a film characterized by a thickness of 40 nm, and may be upwards of five times greater than a film characterized by a thickness of 80 nm. Accordingly, by forming a layer of atomic-layer deposited aluminum oxide characterized by a thickness of less than or about 20 nm, less than or about 15 nm, less than or about 10 nm, or less, the film may have greatly increased flexibility as compared to thicker films. Although the film may be characterized by increased permeability, in coatings according to embodiments of the present technology, by incorporating additional layers, the complete coating permeability may be greatly reduced, and may be superior to conventional barrier layers while increasing the film flexibility over conventional barrier layers as well.

To improve protection of the aluminum oxide layer, or any atomic-layer deposited layer, an overlying layer may be characterized by increased thickness. The overlying layer, such as silicon nitride, or any other material or composition noted previously, may protect the underlying metal-containing layer from corrosion, as well as facilitate barrier performance when formed according to embodiments of the present technology. For example, an overlying layer, such as plasma-enhanced chemical-vapor deposited silicon nitride as a non-limiting example, may be formed to an increased thickness compared to the atomic-layer deposited material. For example, the overlying layer may be formed to a thickness of greater than or about 20 nm, greater than or about 50 nm, greater than or about 100 nm, or greater. In combination, the overall coating can have improved permeability over discrete layers, while retaining increased flexibility.

For example, the added layer may improve permeability by up to an order of magnitude, and may produce films characterized by a water-vapor transmission rate of less than or about $1.0\times10^{-3}$ g/(m$^2$·day), and which may be characterized by a water-vapor transmission rate of less than or about $7.5\times10^{-4}$ g/(m$^2$·day), less than or about $5.0\times10^{-4}$ g/(m$^2$·day), less than or about $2.5\times10^{-4}$ g/(m$^2$·day), less than or about $2.0\times10^{-4}$ g/(m$^2$·day), less than or about $1.0\times10^{-4}$ g/(m$^2$·day), less than or about $9.0\times10^{-5}$ g/(m$^2$·day), less than or about $8.0\times10^{-5}$ g/(m$^2$·day), less than or about $7.0\times10^{-5}$ g/(m$^2$·day), less than or about $6.0\times10^{-5}$ g/(m$^2$·day), less than or about $5.0\times10^{-5}$ g/(m$^2$·day), less than or about $4.0\times10^{-5}$ g/(m$^2$·day), less than or about $3.0\times10^{-5}$ g/(m$^2$·day), or less. Additionally, the materials may be characterized by a saturation crack density of greater than or about 250/mm, and may be greater than or about 300/mm, greater than or about 350/mm, greater than or about 400/mm, greater than or about 450/mm, greater than or about 500/mm, greater than or about 550/mm, greater than or about 600/mm, greater than or about 650/mm, greater than or about 700/mm, or higher.

Any of the layers of material may be formed in processing chambers or systems having delivery setups configured for atomic-layer deposition, plasma-enhanced chemical-vapor deposition, or any other formation or deposition process for producing coating layers as discussed above. In some embodiments, coatings according to the present technology may be formed in track or inline deposition systems allowing greater batches of components to be coated at a time. This may allow the technology to be performed in systems that may be scaled to accommodate any number of substrates. The systems may include any number of components or characteristics as will be described further below, but the systems may be accommodated by a method for coating multiple substrates during a process. Again, any of the systems discussed below may be configured to perform any of the processes discussed previously, and may be used to process any substrates as noted above.

Figure 6:
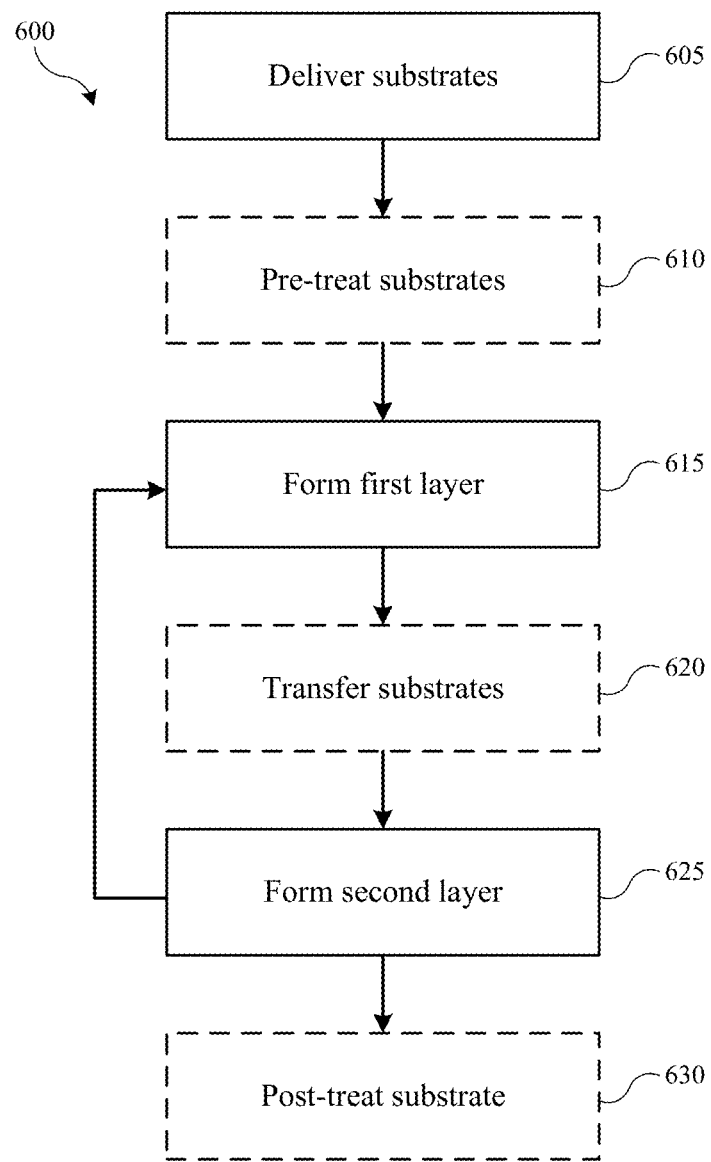
FIG. 6 shows selected operations in a method of forming a coating structure according to some embodiments of the present technology.

FIG. 6 shows selected operations in a method 600 of forming a coating structure according to some embodiments of the present technology. Method 600 may discuss operations as may be performed by any of the chambers discussed below, and may include operations of any method discussed previously. Many operations of method 600 may be performed, for example, in the chambers or systems as further described below, as well as any combination of systems discussed, or which may be configured to perform operations as discussed for method 600. Method 600 may include one or more operations prior to the initiation of the method, including processing to produce or prepare a container for application of a coating or a layer of a coating according to embodiments of the present technology, including forming one or more layers, such as by one or more other processes as discussed throughout the present disclosure. For example, upstream processing may be performed as described above. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 600 may include one or both of method 400 or method 500, or aspects or operations from either method, and method 600 may describe a method for coating multiple substrates. The method may form one or more layers of material, which may include some or all of the characteristics of any of the methods previously described.

In some embodiments method 600 may include an operation of providing a set of substrates, such as containers, vessels, syringes, stoppers, plungers, surgical devices or instruments, medical implants or medical implant components, or any other set of components on which a coating may be formed. The substrates may be received in sheets coupling the components together, such as a sheet of extruded stoppers or plungers as discussed above. Additionally, the substrates may be placed in trays or holders, which may seat each component prior to performing a coating operation, and which may facilitate coating on selected surfaces of the substrates as will be shown below. The substrates may be delivered to a processing chamber or system at operation 605. The processing chamber may include any chamber discussed elsewhere or any chamber or system configured to process substrates or form coatings. Although a number of inline deposition systems will be described below, it is to be understood that any number of modifications may be made to accommodate aspects of processing while still being encompassed by the present technology. Additionally, the present technology may be performed in a number of standalone chambers that include disposing substrates within a processing chamber, and which remain stationary during deposition or formation operations. Accordingly, the present technology is not intended to be limited to inline deposition systems alone.

Substrates may be moved through the processing system or chamber along a track or tread, which may allow the substrates to be exposed to one or more operations. Exemplary operations may include any number of operations as discussed previously, or elsewhere. For example, a pre-treatment operation may be performed at optional operation 610 to prepare a surface of the substrate for deposition, to activate the surface, to clean the surface, or to perform one or more additional operations in anticipation of a deposition operation. The pre-treatment may be or include any operation discussed above, including a plasma treatment, for example. The substrate may then continue along or be driven further along the system, as well as being delivered to a separate system for performing subsequent operations of method 600.

At operation 615, the method may include forming a first layer of material on the substrate. The first layer may be formed by any of the processes as discussed previously, including by any set or subset of operations from method 400 or method 500, for example. After a first layer of material has been formed, method 600 may include transferring the substrates to an additional chamber at optional operation 620, although in some embodiments the subsequent deposition or formation may occur within the same chamber as the first layer formation. For example, the chamber may include additional aspects affording multiple formation operations to occur within the chamber as substrates are being delivered through the system. Additionally, a second chamber may be coupled with the same track or delivery aspect as the first chamber, such as further along the line, for example. The second chamber may also be part of a separate track system entirely in some embodiments of the present technology.

Once received at a subsequent station, method 600 may include forming a second layer of material at operation 625. The second layer may be formed by any of the processes as discussed previously, including by any set or subset of operations from method 400 or method 500, for example. After the second layer of material has been formed, method 600 may include repeating aspects of the process to form one or more additional layers, which may be the same materials and/or processes as either the first or second layer formation operations. After a desired number of layers have been formed, method 600 may involve performing a post-treatment operation at optional operation 630. The post-treatment may be or include any operation discussed above, including a plasma treatment, for example, which may occur in any chamber in which the first layer formation or the second layer formation occurs, a chamber in which the pre-treatment occurs, or an additional chamber of the system. The post treatment operation may include a plasma treatment, application of a layer of material for lubricity, or any other operation to finalize the coating produced.

Figure 7:
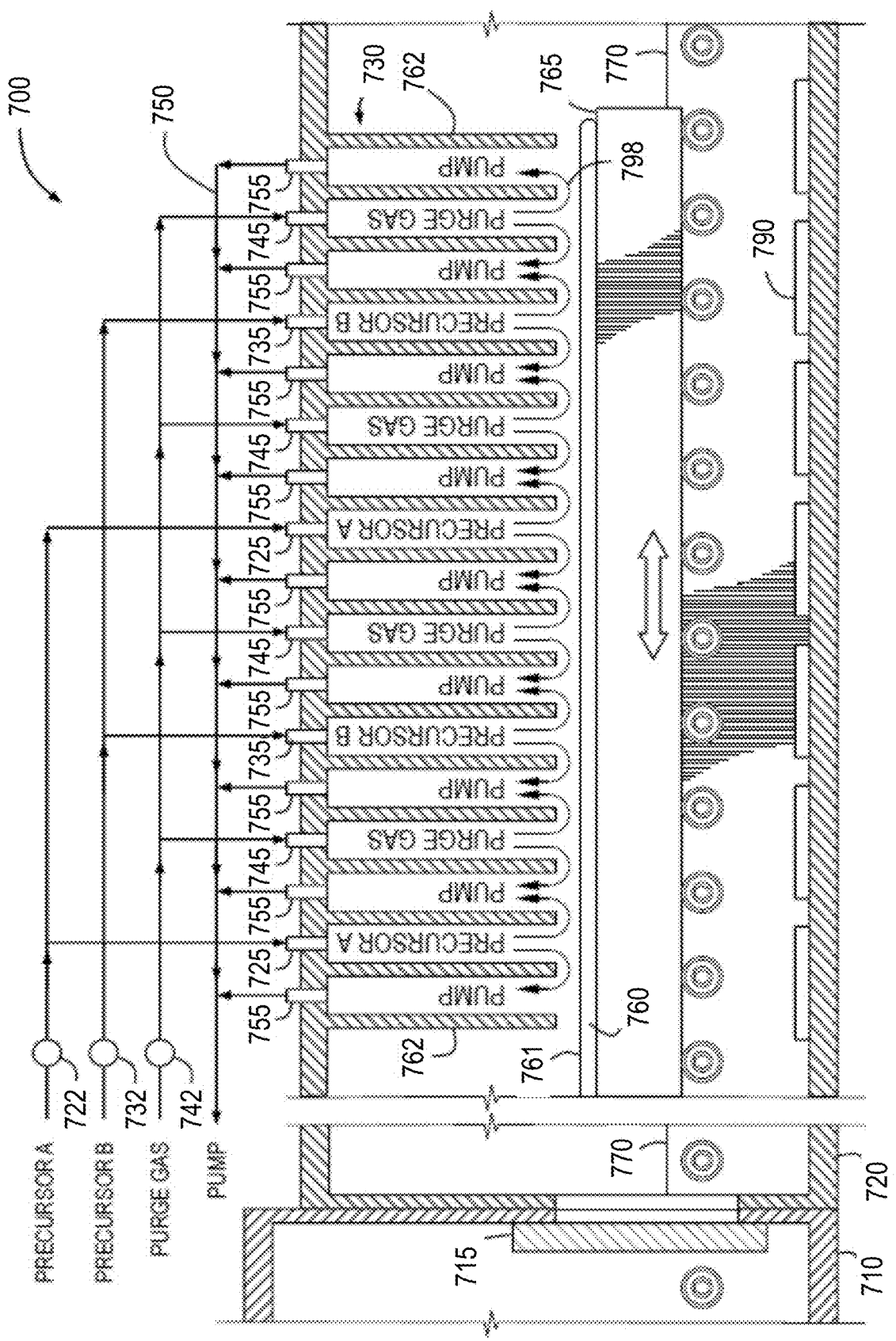
FIG. 7 shows a schematic cross-sectional view of an exemplary processing chamber according to some embodiments of the present technology.

The operations of method 600, as well as any number of operations from method 400 or method 500, may be performed in one or more processing chambers. The following discussion will address a number of processing chambers that may be utilized in aspects of the present technology to produce one or more layers of material on a substrate. Any of the following chambers and systems may be combined together to produce systems for depositing or forming multiple layers for coating substrates according to embodiments of the present technology. Turning to FIG. 7 is shown a schematic cross-sectional view of an atomic-layer deposition system 700 or reactor in accordance with one or more embodiments of the present technology, and may illustrate an atomic-layer deposition chamber configured for inline deposition or formation of layers of coating according to some embodiments of the present technology. It is to be understood that system 700 may include any component or system as described elsewhere for any other chamber, and may be configured to perform any method according to embodiments of the present technology as previously described. The system 700 may include a load lock chamber 710 and a processing chamber 720. The processing chamber 720 may be generally a sealable enclosure, which may be operated under vacuum, or at least low pressure. The processing chamber 720 may be isolated from the load lock chamber 710 by an isolation valve 715. The isolation valve 715 may seal the processing chamber 720 from the load lock chamber 710 in a closed position and may allow a substrate 760 to be transferred from the load lock chamber 710 through the valve to the processing chamber 720 and vice versa in an open position.

The system 700 may include a gas distribution plate 730 capable of distributing one or more gases across a substrate 760. The gas distribution plate 730 may be any suitable distribution plate known to those skilled in the art, and specific gas distribution plates described should not be taken as limiting the scope of the technology. The output face of the gas distribution plate 730 may face the first surface 761 of the substrate 760.

The gas distribution plate 730 may include a plurality of gas ports configured to transmit one or more gas streams to the substrate 760 and a plurality of vacuum ports disposed between each gas port and configured to transmit the gas streams out of the processing chamber 720. As illustrated in FIG. 7, the gas distribution plate 730 may include a first precursor injector 722, a second precursor injector 732 and a purge gas injector 742. The injectors 722, 732, 742 may be controlled by a system computer, such as a mainframe, or by a chamber-specific controller, such as a programmable logic controller. The precursor injector 722 may be configured to inject a continuous or pulse stream of a reactive precursor of compound A into the processing chamber 720 through a plurality of gas ports 725. The precursor injector 732 may be configured to inject a continuous or pulse stream of a reactive precursor of compound B into the processing chamber 720 through a plurality of gas ports 735. The purge gas injector 742 may be configured to inject a continuous or pulse stream of a non-reactive or purge gas into the processing chamber 720 through a plurality of gas ports 745. The purge gas may be configured to remove reactive material and reactive by-products from the processing chamber 720. The purge gas may typically be an inert gas, such as nitrogen, argon, or helium. Gas ports 745 may be disposed in between gas ports 725 and gas ports 735 so as to separate the precursor of compound A from the precursor of compound B, thereby avoiding cross-contamination between the precursors.

In another aspect, a remote plasma source may be connected to the precursor injector 722 and the precursor injector 732 prior to injecting the precursors into the processing chamber 720. The plasma of reactive species may be generated by applying an electric field to a compound within the remote plasma source. Any power source that is capable of activating the intended compounds may be used. For example, power sources using DC, radio frequency, and microwave based discharge techniques may be used. If an RF power source is used, it can be either capacitively or inductively coupled. The activation may also be generated by a thermally based technique, a gas breakdown technique, a high intensity light source, such as ultraviolet light, or exposure to an x-ray source.

The system 700 may further include a pumping system 750 connected to the processing chamber 720. The pumping system 750 may be generally configured to evacuate the gas streams out of the processing chamber 720 through one or more vacuum ports 755. The vacuum ports 755 may be disposed between each gas port so as to evacuate the gas streams out of the processing chamber 720 after the gas streams react with the substrate surface and to further limit cross-contamination between the precursors.

The system 700 may include a plurality of partitions 762 disposed on the processing chamber 720 between each port. A lower portion of each partition may extend close to the first surface 761 of substrate 760, such as, for example, about 0.5 mm or greater from the first surface 761. In this manner, the lower portions of the partitions 762 may be separated from the substrate surface by a distance sufficient to allow the gas streams to flow around the lower portions toward the vacuum ports 755 after the gas streams react with the substrate surface. Arrows 798 indicate the direction of the gas streams. Since the partitions 762 may operate as a physical barrier to the gas streams, they may also limit cross contamination between the precursors. The arrangement shown is merely illustrative and should not be taken as limiting the scope of the technology. It will be understood by those skilled in the art that the gas distribution system shown is merely one possible distribution system and that other types of showerheads may be employed.

In operation, a substrate 760 may be delivered, such as by a robot, to the load lock chamber 710 and may be placed on a shuttle 765, which may be a tray as discussed elsewhere. After the isolation valve 715 is opened, the shuttle 765 may be moved along the track 770. Once the shuttle 765 enters in the processing chamber 720, the isolation valve 715 may close, sealing the processing chamber 720 and allowing a vacuum to be formed within the system. The shuttle 765 may then be moved through the processing chamber 720 for processing. In one embodiment, the shuttle 765 may be moved in a linear path through the chamber.

As the substrate 760 moves through the processing chamber 720, the first surface 761 of substrate 760 may be repeatedly exposed to the precursor of compound A coming from gas ports 725 and the precursor of compound B coming from gas ports 735, with the purge gas coming from gas ports 745 in between. Injection of the purge gas may be designed to remove unreacted material from the previous precursor prior to exposing the substrate surface 761 to the next precursor. After each exposure to the various gas streams, the gas streams may be evacuated through the vacuum ports 755 by the pumping system 750. Since a vacuum port may be disposed on both sides of each gas port, the gas streams may be evacuated through the vacuum ports 755 on both sides. Thus, the gas streams may flow from the respective gas ports vertically downward toward the first surface 761 of the substrate 760, across the first surface 761 and around the lower portions of the partitions 762, and finally upward toward the vacuum ports 755. In this manner, each gas may be uniformly distributed across the substrate surface 761. Substrate 760 may also be rotated while being exposed to the various gas streams. Rotation of the substrate may be useful in preventing the formation of stripes in the formed layers. Rotation of the substrate may be continuous or in discrete steps.

The extent to which the substrate surface 761 is exposed to each gas may be determined by, for example, the flow rates of each gas coming out of the gas port and the rate of movement of the substrate 760. In some embodiments, the flow rates of each gas may be configured so as not to remove adsorbed precursors from the substrate surface 761. The width between each partition, the number of gas ports disposed on the processing chamber 720, and the number of times the substrate may be passed back and forth may also determine the extent to which the substrate surface 761 is exposed to the various gases. Consequently, the quantity and quality of a deposited film may be optimized by varying the above-referenced factors.

In some embodiments, the system 700 may include a precursor injector 722 and a precursor injector 732, without a purge gas injector 742. Consequently, as the substrate 760 moves through the processing chamber 720, the substrate surface 761 may be alternately exposed to the precursor of compound A and the precursor of compound B, without being exposed to purge gas in between. The embodiment shown in FIG. 7 has the gas distribution plate 730 above the substrate. While the embodiments have been described and shown with respect to this upright orientation, it will be understood that the inverted orientation is also possible. In that situation, the first surface 761 of the substrate 760 may face downward, while the gas flows toward the substrate may be directed upward. In one or more embodiments, at least one radiant heat source 790 may be positioned to heat the second side of the substrate.

In some embodiments, the shuttle 765 may be susceptor for carrying the substrate 760. Generally, the susceptor may be a carrier which helps to form a uniform temperature across the substrate. The susceptor may be movable in both directions left-to-right and right-to-left, relative to the arrangement of FIG. 7, between the load lock chamber 710 and the processing chamber 720. The susceptor may have a top surface for carrying the substrate 760. The susceptor may be a heated susceptor so that the substrate 760 may be heated for processing. As an example, the susceptor may be heated by radiant heat source 790, a heating plate, resistive coils, or other heating devices, disposed underneath the susceptor. Although illustrated as a lateral transition, embodiments of system 700 may also be utilized in a rotationally based system in which a wheel may rotate clockwise or counter-clockwise to successively treat one or more substrates positioned under the gas distribution system illustrated. Additional modifications are similarly understood to be encompassed by the present technology.

Figure 8:
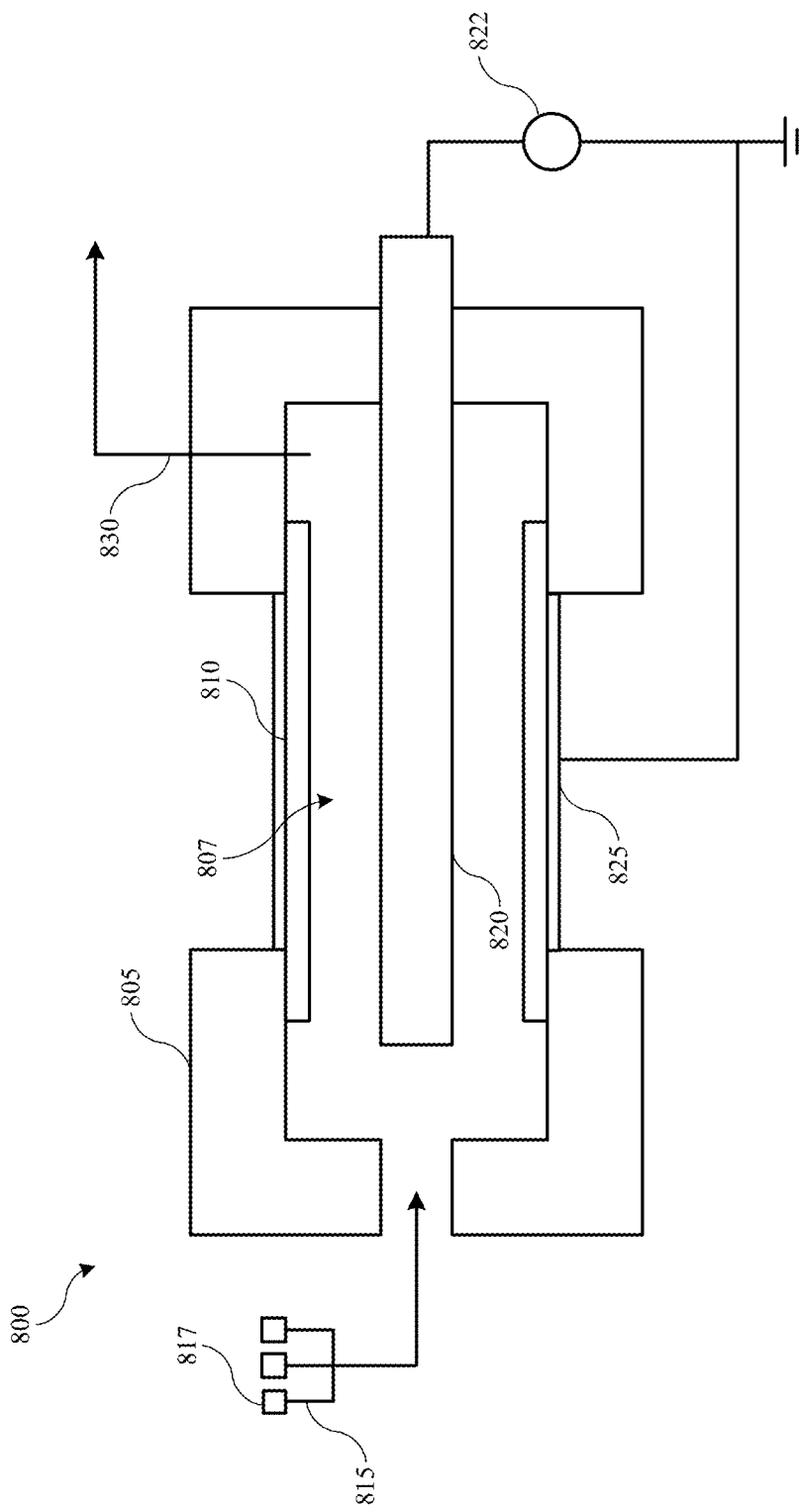
FIG. 8 shows a schematic cross-sectional view of an exemplary processing chamber according to some embodiments of the present technology.

FIG. 8 shows a schematic cross-sectional view of an exemplary processing chamber 800 according to some embodiments of the present technology, and may illustrate aspects of a tubular deposition system, which may be used to coat one or more surfaces with one or more layers of materials according to embodiments of the present technology. It is to be understood that chamber 800 may include any component or system as described elsewhere for any other chamber, and may be configured to perform any method according to embodiments of the present technology as previously described. Chamber 800 may facilitate deposition along syringe barrels, as well as other components. For example, a sheet of stoppers or plungers, such as discussed previously, may be rolled to produce a cylinder that can be inserted within chamber 800 to facilitate coating of the components. Chamber 800 is illustrated schematically, and may include any number of additional components to facilitate coating of components according to embodiments of the present technology.

For example, chamber 800 may include a chamber body 805, which may define a processing region 807 of the chamber. A tubular or arcuate substrate 810 may be seated against the exterior of the processing region during processing. A gas delivery system 815 may include a number of precursor injectors 817 as previously described, and which may deliver one or more precursors into the processing region 807. Although only three such injectors are illustrated, it is to be understood that any number of injectors may be included in embodiments of the present technology. Chamber 800 may include a source electrode 820, which may be a rod or cylinder, and which may be operated to generate a plasma of precursors delivered from gas delivery system 815.

Source electrode 820 may be electrically coupled with a power supply 822, which may be an RF power supply, or any other power supply configured to provide power for generating a plasma within processing region 807 of processing chamber 800. Chamber 800 may also include a liner 825, which may also be annular in design, and may extend about the processing chamber. The liner 825 may be a conductive liner, which may be disposed in contact with substrate 810, allowing the substrate to operate as an electrode on which deposition or formation may occur. Deposition byproducts and unreacted precursor material may be exhausted through a port 830, which may lead to an exhaust foreline or pump in some embodiments. By utilizing a tubular reactor in some embodiments, the present technology may more uniformly coat tubular surfaces according to some embodiments of the present technology.

FIG. 9A shows a schematic cross-sectional view of an exemplary processing chamber 900 according to some embodiments of the present technology, and may illustrate aspects of an inline deposition system, which may be used to coat one or more surfaces with one or more layers of materials according to embodiments of the present technology. It is to be understood that chamber 900 may include any component or system as described elsewhere for any other chamber, and may be configured to perform any method according to embodiments of the present technology as previously described. Chamber 900 may facilitate deposition of plasma enhanced products, which may be deposited on substrates as they travel along a track system to increase throughput for coating components. Chamber 900 is illustrated schematically, and may include any number of additional components to facilitate coating of components according to embodiments of the present technology.

Unlike system 700 described previously, processing chamber 900 may not include a load lock or separated chamber spaces, although a number of chambers or systems according to embodiments of the present technology may include such components. Chamber 900 may still be operated under vacuum in some embodiments, which may facilitate formation of plasma as will be described below. To facilitate vacuum operations, chamber 900 may include a housing 905, which may define access to the system with limited gap tolerances as illustrated. As illustrated, housing 905 may extend proximate a substrate tray 910 or shuttle as previously described, although sheets of substrate material may also be provided. In some embodiments, the housing may be contacted by the trays as they pass into the chamber to minimize leakage into the chamber, or a flap may extend from the housing 905 to contact an upper surface of the trays to limit leakage into the chamber.

The trays 910 may travel along a track 915, which may deliver the substrates to a deposition region 920, where any number of deposition operations may be performed. For example, as illustrated, processing chamber 900 may be configured to form plasma of a precursor, such as an oxygen precursor or secondary precursor as previously described, which may then interact with a first precursor to produce deposition products. For example, the secondary precursor may be delivered at a first location 925, which may be proximate or in a flow path of a plasma source 930. The plasma source 930 may energize the secondary precursor to produce plasma effluents, which may continue to flow to contact a deposition precursor 935 delivered into the deposition region downstream of the plasma source. The interaction of the plasma effluents with the deposition precursor may produce deposition products, which may be deposited on a substrate passing through the deposition region.

As illustrated, some trays or sheets of substrates may by characterized by a rectangular shape, and thus aspects of the deposition area, including a shape of the plasma source, may be similarly rectangular in some embodiments to facilitate deposition on substrates according to embodiments of the present technology. It is to be understood that the configuration of delivery can also be changed according to embodiments of the present technology, such as where a radical source is delivered adjacent a deposition precursor, similar to plasma enhancing one of the precursors of processing system 700 described above. Additionally, multiple layers may be applied to the substrate with modifications of the configuration as illustrated. For example, in some embodiments the system may include an additional deposition area in the direction of travel positioned subsequent the deposition area shown, which may allow a second layer to be deposited overlying the first layer, and may maintain certain vacuum conditions, for example. Additionally, a tray of substrates may exit processing chamber 900 and be provided to a second processing chamber having a similar or different configuration and depositing a separate layer, and which may be on the same track system or a different track system. Any number of additional modifications may be made to develop coatings according to embodiments of the present technology.

FIGS. 9B-9C show schematic cross-sectional views of exemplary substrates as may be delivered to processing chambers according to some embodiments of the present technology, and may illustrate one example of substrates, such as vessels as noted above, positioned or seated in trays for delivery through processing chambers as previously described. Trays according to embodiments of the present technology may include a number of components or designs that may facilitate coating a single surface of the substrate, or multiple surfaces of the substrate. For example, as illustrated in FIG. 9A, tray 910*a* may illustrate one example of a tray configured to facilitate coating interior surfaces, while masking exterior surfaces of a vessel. Tray 910*a* may define receptacles for receiving substrates 940 within the tray. In some embodiments, tray 910*a* may include a lid 950, which may extend over the substrates and may define apertures or skirts 955, which may seal about a neck or head of the substrate to define a deposition region extending along an interior surface of the vessel. Such a configuration may provide for coating interior surfaces of a substrate while maintaining exterior surfaces free of coating, for example.

Similarly, FIG. 9B may illustrate a tray 910*b* configured to facilitate coating exterior surfaces, while masking interior surfaces of the vessel. For example, tray 910*b* may define protrusions 960, which may seat within the neck of the vessel. In embodiments, coatings according to the present technology may be applied to any number of surfaces, and may be applied to an entire substrate. For example, the vessel may be coated utilizing tray 910*a*, which may allow a coating with any number of layers to be applied to interior surfaces. The vessel may then be seated in tray 910*b*, which may allow coating of exterior surfaces. In embodiments, coatings on interior and exterior surfaces may be the same, such as where an entire vessel may be coated with a consistent coating, or different surfaces may be characterized by different coatings. As one non-limiting example, a coating for lubricity may be coated on one or more interior surfaces of a vessel or stopper, for example, while being excluded on one or more exterior surfaces. Any combination of coatings or layers may be utilized according to embodiments of the present technology.

Figure 10:
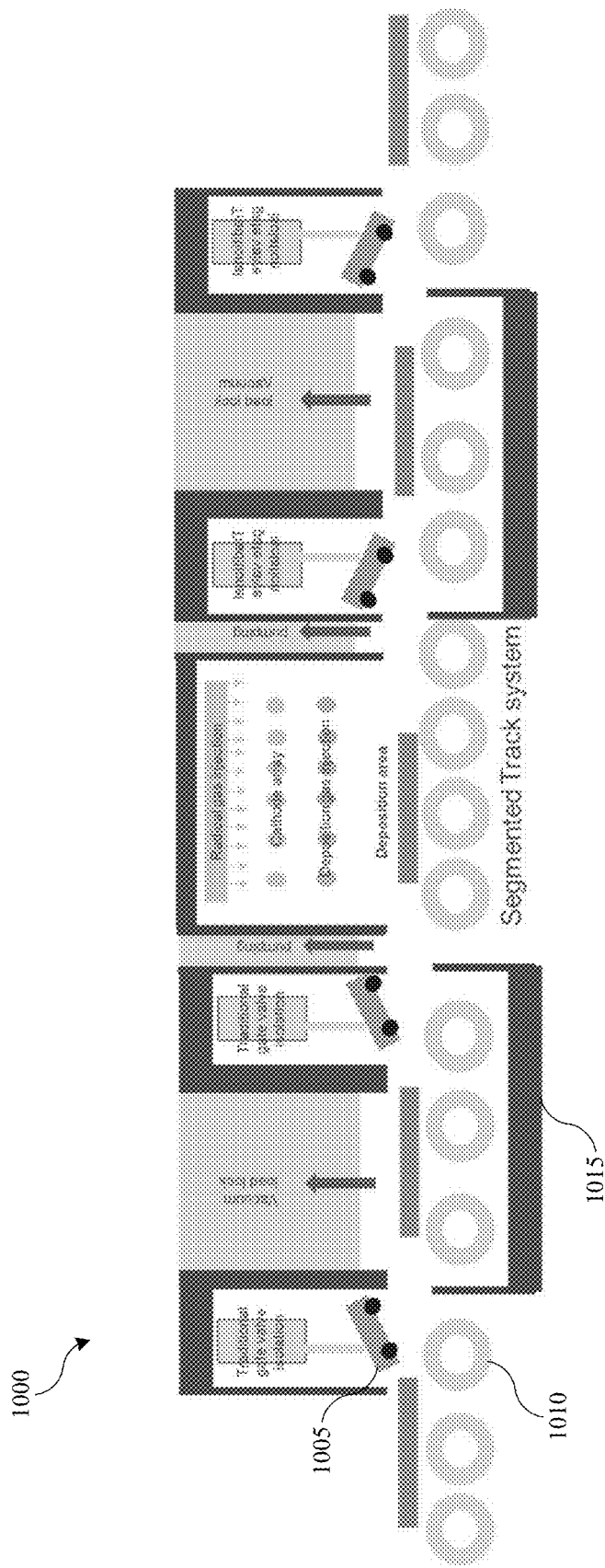
FIG. 10 shows a schematic cross-sectional view of an exemplary processing chamber according to some embodiments of the present technology.

FIG. 10 shows a schematic cross-sectional view of an exemplary processing chamber 1000 according to some embodiments of the present technology, and may illustrate aspects of an inline deposition system, which may be used to coat one or more surfaces with one or more layers of materials according to embodiments of the present technology. It is to be understood that chamber 1000 may include any component or system as described elsewhere for any other chamber, and may be configured to perform any method according to embodiments of the present technology as previously described. Chamber 1000 may be similar to chamber 900 described above, and may include any aspect of that chamber. Chamber 1000 may also illustrate a similar system in which vacuum may be produced by incorporating isolation valves 1005, which may allow complete sealing of the chamber. Additionally, track 1010 may be segmented differently from the continuous track previously described, and which may allow sections of the track to be incorporated within housing 1015, further facilitating vacuum processing. It is to be understood that any number of additional modifications may be included.

Figure 11B:
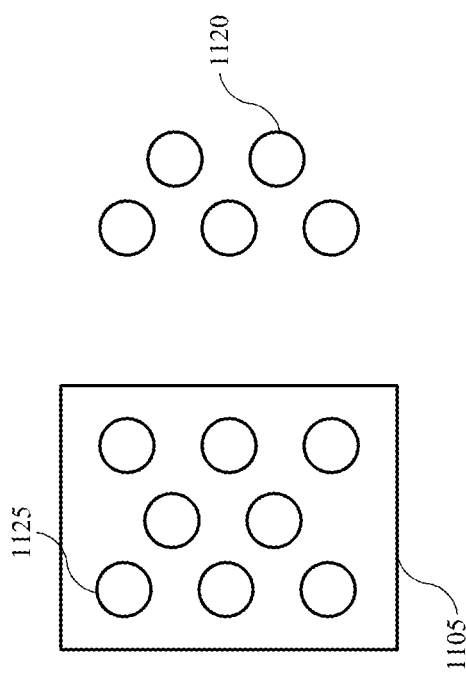
FIG. 11B shows a schematic top view of an exemplary processing chamber according to some embodiments of the present technology.
Figure 11A:
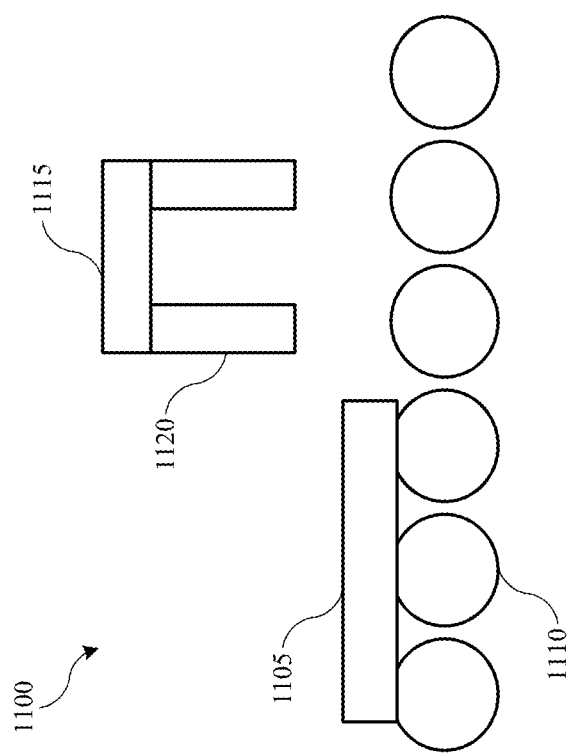
FIG. 11A shows a schematic cross-sectional view of an exemplary processing chamber according to some embodiments of the present technology.

FIG. 11A shows a schematic cross-sectional view of an exemplary processing chamber 1100 according to some embodiments of the present technology, and may illustrate aspects of an inline deposition system, which may be used to coat one or more surfaces with one or more layers of materials according to embodiments of the present technology. It is to be understood that chamber 1100 may include any component or system as described elsewhere for any other chamber, and may be configured to perform any method according to embodiments of the present technology as previously described. For example, chamber 1100 illustrates only selected components to emphasize a particular deposition source, although it is to be understood that chamber 1100 may include any number of additional aspects or components described in relation to any of the systems previously described.

Chamber 1100 may illustrate a set of substrates being delivered in a tray 1105 along a track 1110, such as in any system setup that may accommodate the components as well as the processing operations being performed. Chamber 1100 may include a plasma source 1115 that includes a number of plasma nozzles 1120, which may individually perform plasma deposition on surfaces of the substrate, and which may allow deposition to be performed on multiple substrates simultaneously based on utilizing a number of nozzles in a pattern to accommodate the configuration of the substrates. For example, FIG. 11B shows a schematic top view of exemplary processing chamber 1100 according to some embodiments of the present technology, and may illustrate a view of the substrates passing towards a set of nozzles. As shown, tray 1105 may provide the substrates 1125 in a particular configuration or arrangement. Plasma source 1115 may include a set of nozzles 1120 or plasma torches in a similar configuration. Accordingly, discreet movements of the tray may position a set of substrates, such as multiple rows including offset rows, in line with individual plasma source nozzles, and allowing coating to be applied to multiple substrates simultaneously. Although illustrated with overlying nozzles, the system may also be inverted in some embodiments, where the plasma source may be underlying the substrates as they pass, which may limit particle generation that may settle on the substrates, for example. Any number of additional modifications may similarly be performed in embodiments of the present technology.

Figure 12B:
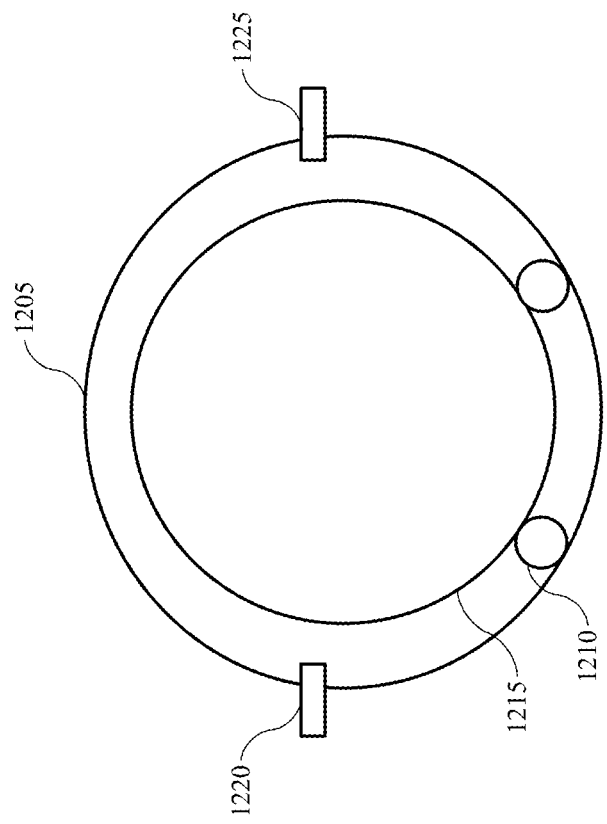
FIG. 12B shows a schematic front view of an exemplary processing chamber according to some embodiments of the present technology.
Figure 12A:
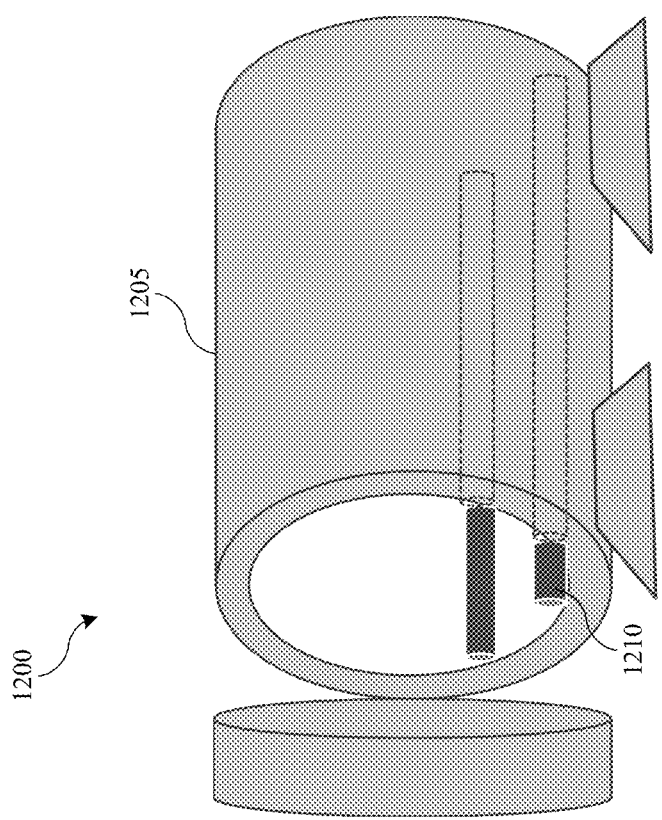
FIG. 12A shows a schematic cross-sectional view of an exemplary processing chamber according to some embodiments of the present technology.

FIG. 12A shows a schematic cross-sectional view of an exemplary processing chamber 1200 according to some embodiments of the present technology, and may illustrate aspects of a rotational or drum deposition system, which may be used to coat one or more components in a batch according to embodiments of the present technology. It is to be understood that chamber 1200 may include any component or system as described elsewhere for any other chamber, and may be configured to perform any method according to embodiments of the present technology as previously described. Chamber 1200 may include an exterior drum 1205, which may include a number of motorized rollers 1210. The rollers may be operated to rotate an interior vessel that may house a number of substrates. For example, in some embodiments coatings may be applied subsequent separation or trimming of components, such as stoppers or plungers. Once formed, a batch of the singular substrates may be included in a drum, and a deposition operation may be performed to apply one or more layers of coating according to any of the methods previously described.

FIG. 12B shows a schematic front view of exemplary processing chamber 1200 according to some embodiments of the present technology, and may illustrate additional aspects of the system. For example, outer drum 1205 may be heated to produce a temperature controlled process environment within the drum. Rollers 1210 may be operated to rotate interior drum 1215, which may be a porous drum or cage, and within which may be housed any number of substrates. One or more process gases may be delivered through a first port 1220, and may or may not be plasma enhanced, and may be plasma enhanced external to the chamber or within the chamber in some embodiments. Deposition byproducts may be exhausted from the chamber through a second port 1225. By utilizing one or more chambers or systems, and by performing one or more methods according to embodiments of the present technology, improved coatings may be applied to any number of containers or devices, which may improve protection of both the component coated, as well as materials contained within the containers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where neither of the limits, either limit, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a coating of material on a substrate, the method comprising:
    forming a plasma of a first precursor and an oxygen-containing precursor, wherein the first precursor and the oxygen-containing precursor are provided in a first flow rate ratio;
    depositing a first layer of material on the substrate, wherein the first layer of material is characterized by a first concentration of hydrogen;
    while maintaining the plasma, adjusting the first flow rate ratio to a second flow rate ratio; and
    depositing a second layer of material on the first layer of material, wherein the second layer of material is characterized by a second concentration of hydrogen less than the first concentration of hydrogen, and wherein a flow-rate ratio of the oxygen-containing precursor to the first precursor is maintained at greater than or about 2.0:1 while depositing the first layer of material on the substrate, depositing the second layer of material on the first layer of material, or both.

2. The method of forming a coating of material on a substrate of claim 1, wherein adjusting the first flow rate ratio to the second flow rate ratio comprises increasing a ratio of a flow rate of the oxygen-containing precursor relative to a flow rate of the first precursor.

3. The method of forming a coating of material on a substrate of claim 2, wherein the first layer of material is characterized by a first concentration of carbon.

4. The method of forming a coating of material on a substrate of claim 3, wherein the second layer of material is characterized by a second concentration of carbon less than the first concentration of carbon.

5. The method of forming a coating of material on a substrate of claim 1, wherein adjusting the first flow rate ratio to the second flow rate ratio is performed to produce a concentration gradient along a thickness of the coating of material.

6. The method of forming a coating of material on a substrate of claim 1, further comprising:
    prior to forming the plasma of the first precursor and the oxygen-containing precursor, treating a surface of the substrate with a plasma.

7. The method of forming a coating of material on a substrate of claim 1, further comprising:
    subsequent depositing the second layer of material on the second layer of material, treating a surface of the second layer of material with a plasma.

8. The method of forming a coating of material on a substrate of claim 1, further comprising:
    depositing a halogen-containing layer overlying the second layer of material.

9. The method of forming a coating of material on a substrate of claim 1, further comprising:
    repeating the method to produce at least two additional layers on the substrate.

10. The method of forming a coating of material on a substrate of claim 1, wherein the substrate comprises a vial or container, a syringe, a syringe plunger, a vial stopper, a surgical instrument, or a medical implant.

11. The method of forming a coating of material on a substrate of claim 1, wherein the first precursor comprises one or more of silicon, titanium, tantalum, aluminum, hafnium, zinc, indium, zirconium, antimony, or germanium.

12. The method of forming a coating of material on a substrate of claim 1, wherein the first precursor comprises one or more of titanium, tantalum, aluminum, hafnium, zinc, indium, zirconium, antimony, or germanium.

* * * * *